United States Patent
Lee et al.

(10) Patent No.: US 9,653,473 B2
(45) Date of Patent: May 16, 2017

(54) SEMICONDUCTOR DEVICE AND METHOD OF MANUFACTURING THE SAME

(71) Applicant: SK hynix Inc., Icheon-si, Gyeonggi-do (KR)

(72) Inventors: Yang Bok Lee, Icheon-si (KR); Ji Seong Kim, Seoul (KR); Sung Ho Choi, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 14/804,768

(22) Filed: Jul. 21, 2015

(65) Prior Publication Data

US 2016/0233231 A1    Aug. 11, 2016

(30) Foreign Application Priority Data

Feb. 6, 2015  (KR) .......................... 10-2015-0018776

(51) Int. Cl.
*H01L 27/11582* (2017.01)
*H01L 27/1157* (2017.01)

(52) U.S. Cl.
CPC .... *H01L 27/11582* (2013.01); *H01L 27/1157* (2013.01)

(58) Field of Classification Search
CPC .................... H01L 27/11582; H01L 27/1158
See application file for complete search history.

(56) References Cited

U.S. PATENT DOCUMENTS

| | | | | |
|---|---|---|---|---|
| 8,996,838 B1* | 3/2015 | D'Abreu | ............ | G11C 16/0466 365/185.12 |
| 9,111,964 B2* | 8/2015 | Sato | .................. | H01L 29/66833 |
| 9,276,133 B2* | 3/2016 | Kim | ..................... | H01L 29/7926 |
| 9,305,938 B2* | 4/2016 | Simsek-Ege | ........ | H01L 27/1157 |
| 9,391,086 B1* | 7/2016 | Soda | ........................ | H01L 21/28 |
| 9,437,300 B2* | 9/2016 | Kamata | .............. | G11C 16/0483 |
| 2013/0309849 A1* | 11/2013 | Jung | ................. | H01L 29/66833 438/479 |
| 2015/0137209 A1* | 5/2015 | Lee | .................... | H01L 27/11582 257/324 |
| 2015/0371993 A1* | 12/2015 | Jung | ..................... | H01L 23/498 257/773 |
| 2015/0380431 A1* | 12/2015 | Kanamori | ......... | H01L 27/11582 257/324 |

FOREIGN PATENT DOCUMENTS

KR        1020120068392 A        6/2012

* cited by examiner

*Primary Examiner* — Asok K Sarkar
*Assistant Examiner* — Grant Withers
(74) *Attorney, Agent, or Firm* — William Park & Associates Ltd.

(57) ABSTRACT

A semiconductor device, including: interlayer insulating patterns and conductive patterns alternately stacked on a substrate; a channel structure passing through the interlayer insulating patterns and the conductive patterns; and tapered patterns interposed between the channel structure and the interlayer insulating patterns, spaced apart with any one of the conductive patterns interposed therebetween, and having widths decreased toward the substrate.

20 Claims, 29 Drawing Sheets

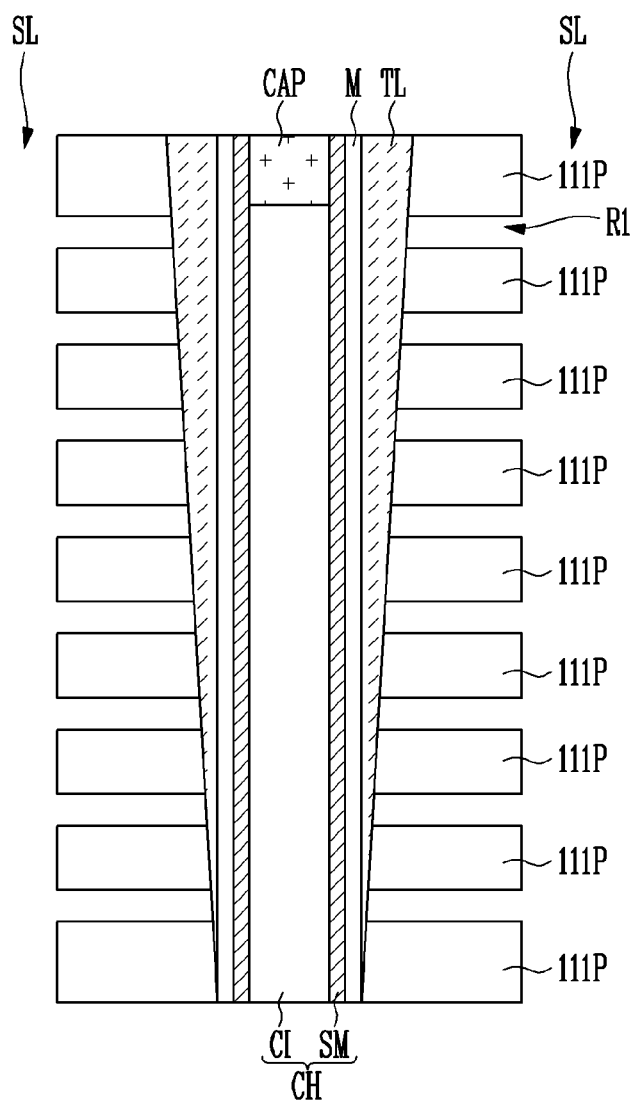

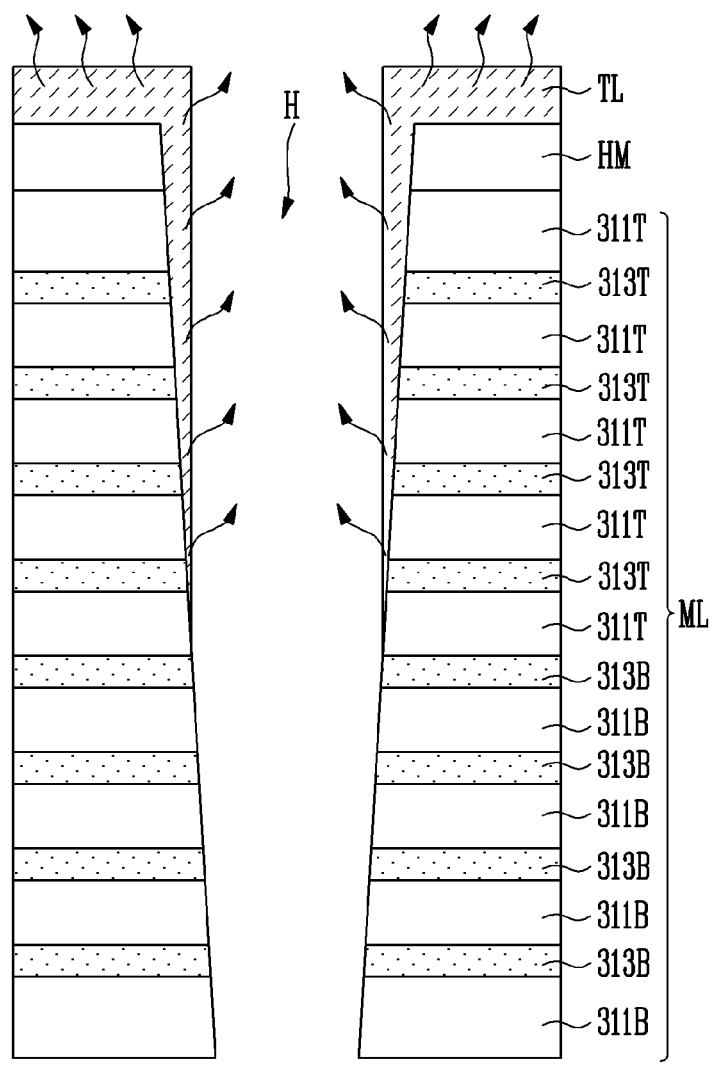

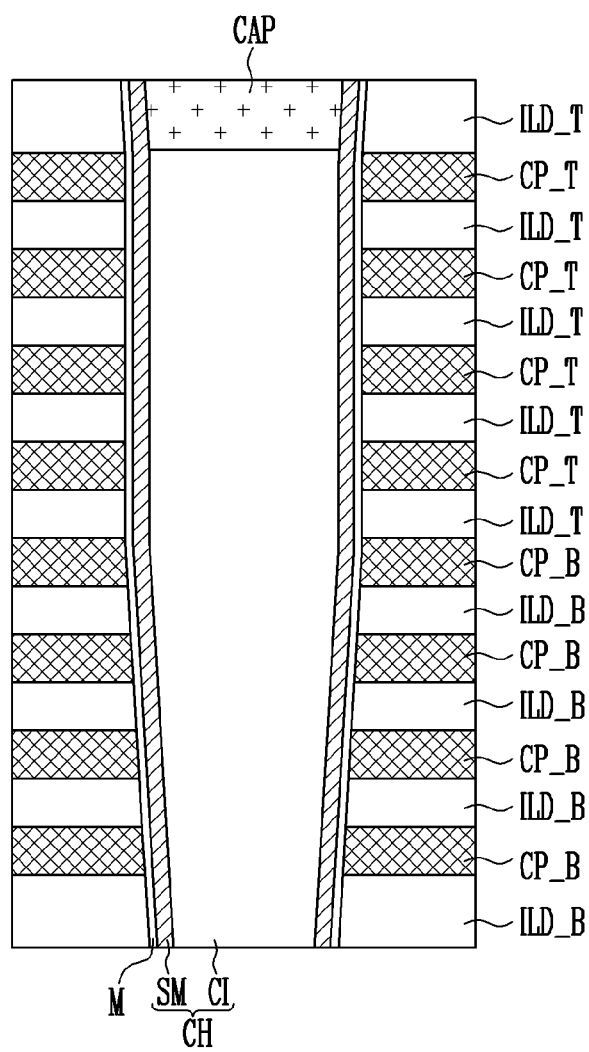

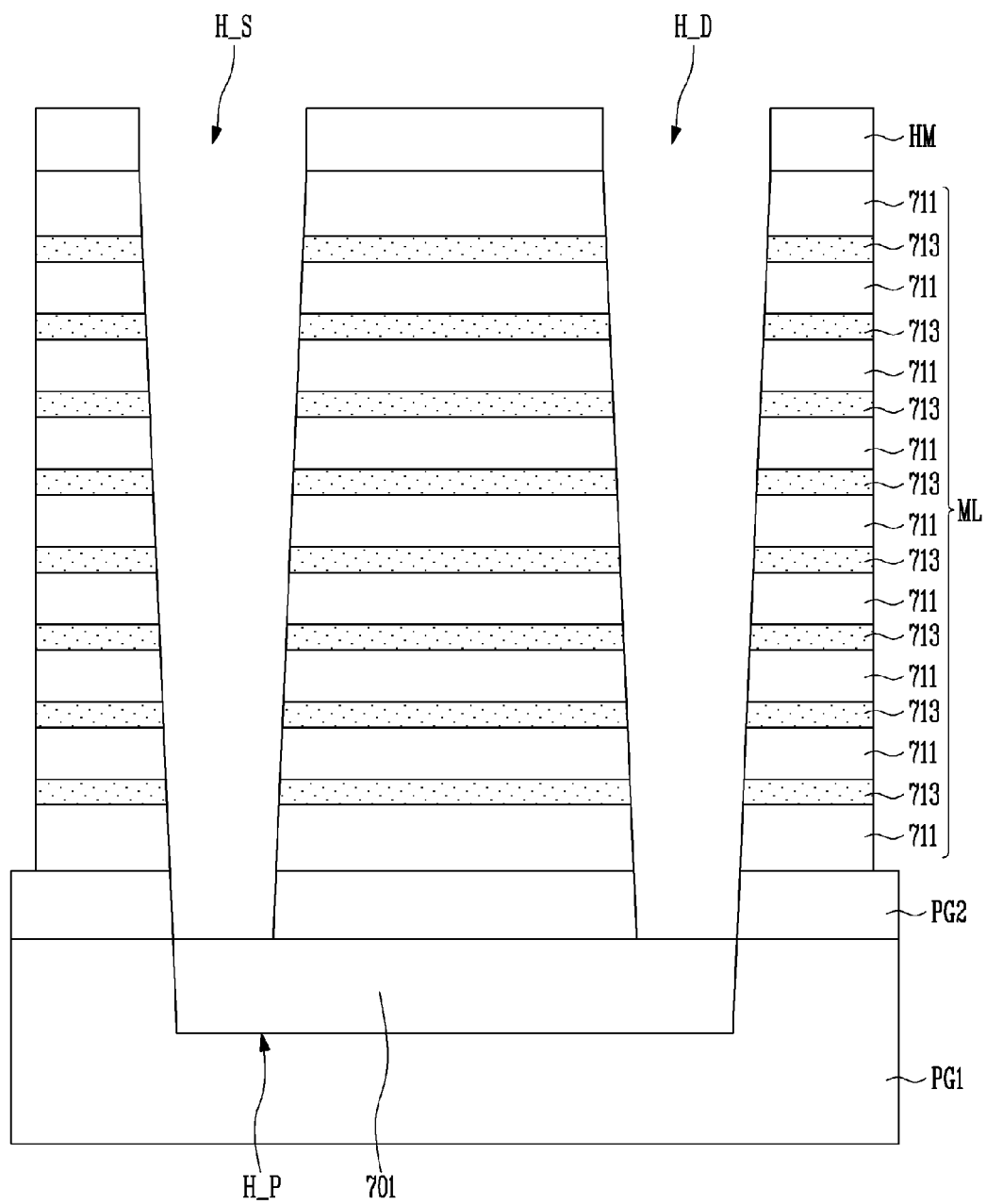

SEMICONDUCTOR DEVICE AND METHOD OF MANUFACTURING THE SAME

CROSS-REFERENCE TO RELATED APPLICATION

The present application claims priority to Korean patent application number 10-2015-0018776 filed on Feb. 6, 2015, in the Korean Intellectual Property Office, the entire disclosure of which is incorporated by reference herein.

BACKGROUND

1. Field

The invention relates to a semiconductor device and a method of manufacturing the same, and more particularly, to a three-dimensional semiconductor device and a method of manufacturing the same.

2. Discussion of Related Art

A semiconductor device has been developed in various structures capable of improving a degree of integration. As an example of the semiconductor device, a three-dimensional (3D) semiconductor device including a 3D semiconductor device has been suggested.

The 3D memory device includes memory cells stacked while being spaced apart from each other along a channel structure. The memory cells are connected to conductive patterns. The conductive patterns may surround the channel structure, and be stacked while being spaced apart from each other along the channel structure.

The aforementioned channel structure is formed inside a hole passing through the alternately stacked conductive patterns and interlayer insulating patterns. The hole is formed by etching a plurality of stacked layers. In this case, a lateral wall of the hole is formed to be inclined. As a result, a width of the hole is varied according to a height of the hole. When the width of the hole is varied according to the height of the hole, the conductive patterns are formed with different widths according to the height of the hole, and a width of the channel structure is varied according to the height of the hole. When a difference in a width between the conductive patterns is increased or a difference in a width of the channel structure according to the height of the hole is increased, it is difficult to secure reliability of an operation of a 3D semiconductor device.

SUMMARY

An embodiment of the invention provides a semiconductor device, including interlayer insulating patterns and conductive patterns alternately stacked on a substrate. The semiconductor device also includes a channel structure passing through the interlayer insulating patterns and the conductive patterns. Further, the semiconductor device also includes tapered patterns interposed between the channel structure and the interlayer insulating patterns, spaced apart with any one of the conductive patterns interposed therebetween, and having widths decreased toward the substrate.

An embodiment of the invention provides a semiconductor device, including lower interlayer insulating patterns and lower conductive patterns alternately stacked on a substrate. The semiconductor device also includes upper interlayer insulating patterns and upper conductive patterns alternately stacked on the lower interlayer insulating patterns and the lower conductive patterns. The semiconductor device also includes a channel structure including an upper region passing through the upper interlayer insulating patterns and the upper conductive patterns and a lower region passing through the lower interlayer insulating patterns and the lower conductive patterns. The semiconductor device also includes upper oxide layer patterns interposed between the upper region and the upper layer interlayer insulating patterns, spaced apart with any one of the upper conductive patterns interposed therebetween, and having widths decreased toward the substrate. The semiconductor device also includes a lower oxide layer patterns interposed between the lower region and the lower interlayer insulating patterns, and spaced apart with any one of the lower conductive patterns interposed therebetween.

An embodiment of the invention provides a semiconductor device, including lower interlayer insulating patterns and lower conductive patterns alternately stacked on a substrate. The semiconductor device also includes upper interlayer insulating patterns and upper conductive patterns alternately stacked on the lower interlayer insulating patterns and the lower conductive patterns. Further, the semiconductor device also includes a channel structure including an upper region, which passes through the upper interlayer insulating patterns and the upper conductive patterns and has a lateral wall inclined at a first angle with respect to a surface of the substrate; and a lower region, which passes through the lower interlayer insulating patterns and the lower conductive patterns and has a lateral wall inclined at a second angle with respect to the surface of the substrate, in which the first angle is closer to 90° than the second angle.

In an embodiment, a method of manufacturing a semiconductor device may include forming a stack structure by alternately stacking interlayer insulating layers and sacrificial layers on a substrate. The method may also include forming a hole passing through the stack structure. The method may also include forming a tapered layer, of which a width is decreased toward the substrate, along a lateral wall of the hole. The method may also include annealing the tapered layer so that a density of the tapered layer is increased.

BRIEF DESCRIPTION OF THE DRAWINGS

FIGS. 2A to 2F are cross-sectional views for describing a method of manufacturing the semiconductor device according to an embodiment of the invention;

FIGS. 6A to 6F are cross-sectional views for describing a method of manufacturing the semiconductor device according to an embodiment of the invention;

FIGS. 9A to 9C are cross-sectional views for describing a method of manufacturing the semiconductor device according to an embodiment of the invention;

FIGS. 12A to 12C are cross-sectional views for describing a method of forming a U-shaped memory string by applying the method of manufacturing the semiconductor device according to an embodiment of the invention;

DETAILED DESCRIPTION

Hereinafter, an embodiment of the invention will be described with reference to the accompanying figures in detail. However, the invention is not limited to an embodiment disclosed below and may be implemented in various forms and the scope of the invention is not limited to the following embodiments. Rather, the embodiment is provided to more sincerely and fully disclose the invention and to completely transfer the spirit of the invention to those skilled in the art to which the invention pertains. Further, the scope of the invention should be understood by the claims of the invention. The invention has been made in an effort to provide a semiconductor device capable of improving reliability of an operation of the semiconductor device, and a method of manufacturing the same Referring to FIG. 1, a cross-sectional view for describing a semiconductor device according to an embodiment of the invention is described.

Figure 1:
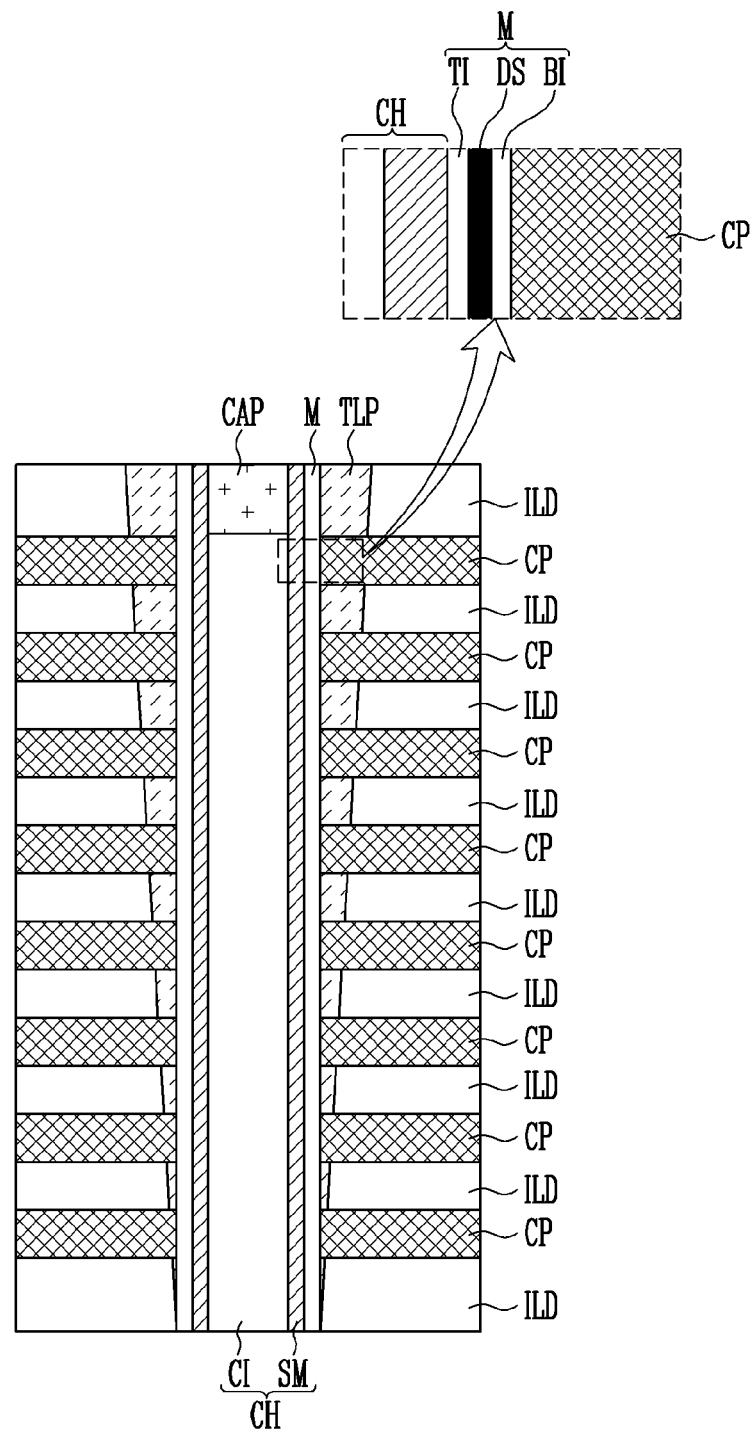
FIG. 1 is a cross-sectional view for describing a semiconductor device according to an embodiment of the invention.

As illustrated in FIG. 1, a semiconductor device according to an embodiment of the invention includes a channel structure CH formed on a substrate (not shown), and a memory string formed along the channel structure CH. The memory string includes transistors formed along the channel structure CH. The transistors include a memory cell transistor and a select transistor.

The substrate may have various lower structures according to a design structure of the memory string. A particular example of the lower structure will be described with reference to FIGS. 11 and 13 below. The channel structure CH may be formed in various forms, such as a straight type, a U-shape, and a W-shape, according to the structure of the memory string. A particular example of the form of the channel structure CH will be described with reference to FIGS. 11 and 13 below.

The channel structure CH may include a tube-type semiconductor layer SM and a core insulating layer CI formed at a center region of the tube-type semiconductor layer SM. The semiconductor layer SM may be formed of an undoped silicon layer. The core insulating layer CI may be formed to be lower than the tube-type semiconductor layer SM. In this case, a capping layer CAP may be formed on the core insulating layer CI. Further, the capping layer CAP may surround the tube-type semiconductor layer SM. The channel structure CH may not include the core insulating layer CI and the capping layer CAP, and may be formed of an embedded semiconductor layer unlike the illustration. The embedded semiconductor layer may be formed while filling from a surface of the channel structure CH to the center region of the channel structure CH in which the core insulating layer CI and the capping layer CAP are disposed. A doping area, into which an impurity is injected, may be formed on the embedded semiconductor layer.

The channel structure CH passes through interlayer insulating patterns ILD and conductive patterns CP which are alternately stacked in every layer. The interlayer insulating patterns ILD are stacked while being spaced apart from each other along the channel structure CH. The conductive patterns CP are interposed between the interlayer insulating patterns ILD. Tapered patterns TLP are interposed between the channel structure CH and the interlayer insulating patterns ILD.

A width of each of the tapered patterns TLP is decreased toward a lower side heading the substrate. The tapered patterns TLP may include an oxide layer. The tapered patterns TLP may be separated by the conductive patterns CP stacked while surrounding the channel structure CH. The tapered patterns TLP are spaced apart from each other with any one among the conductive patterns CP interposed therebetween. The tapered patterns TLP are formed to have a large width toward an upper side far from the substrate. An upper pattern among the tapered patterns TLP has a larger width than that of a lower pattern disposed under the upper pattern and is closer to the substrate than the upper pattern.

The conductive patterns CP and the interlayer insulating patterns ILD are disposed on planes having different heights. The conductive patterns CP are disposed between the interlayer insulating patterns ILD formed on planes having different heights. Any one of the conductive patterns CP is disposed between the adjacent interlayer insulating patterns ILD. The interlayer insulating patterns ILD surround the channel structure CH with the tapered patterns TLP interposed therebetween. To secure stability of a manufacturing process, the interlayer insulating patterns ILD may be formed of a denser film quality than that of the tapered patterns TLP. The interlayer insulating patterns ILD may be formed of a material having a higher density than that of the tapered patterns TLP.

Due to a characteristic of the manufacturing process, a width of each of the interlayer insulating patterns ILD may be increased toward the lower side close to the substrate. Further, lateral walls of the interlayer insulating patterns ILD adjacent to the channel structure CH may be formed to be inclined at an angle larger than 90° with respect to a surface of the substrate. According to an embodiment of the invention, the tapered patterns TLP, of which the widths are decreased toward the lower side, are disposed on the inclined lateral walls of the interlayer insulating patterns ILD, of which the widths are increased toward the lower side, so that an inclination degree of the lateral walls of the tapered patterns TLP adjacent to the channel structure CH may be formed to be close to 90° with respect to the surface of the substrate. Accordingly, in an embodiment of the invention, it is possible to decrease or remove a width difference of the channel structure CH according to the height of the channel structure CH, or it is possible to unify a thickness of the semiconductor layer SM of the channel structure CH. When the thickness of the semiconductor layer SM of the channel structure CH is uniform, operation stability of the semiconductor device is increased, thereby improving reliability of an operation of the semiconductor device.

The conductive patterns CP protrude toward the channel structure CH compared to the interlayer insulating patterns ILD. Further, the conductive patterns CP may have lateral walls which do not accord with the inclination degree of the lateral walls of the interlayer insulating patterns ILD, and are parallel to the lateral walls of the tapered patterns TLP toward the channel structure CH. Accordingly, in an embodiment of the invention, it is possible to decrease or remove a width difference between the conductive patterns CP formed on planes having different heights, so that it is possible to improve uniformity of the widths between the conductive patterns CP formed on the planes having different heights. When the widths between the conductive patterns CP are uniform, it is possible to decrease a difference in a program speed and an erase speed between the memory cell transistors electrically coupled to the conductive patterns CP. Accordingly, in an embodiment of the invention, it is possible to improve reliability of the operation of the semiconductor device.

A memory layer M may be formed along an external wall of the channel structure CH. The memory layer M may surround the channel structure CH along spaces between the tapered patterns TLP and the channel structure CH and spaces between the conductive patterns CP and the channel structure CH. The memory layer M may include a blocking insulating layer BI, a data storing layer DS, and a tunnel insulating layer TI. The tunnel insulating layer TI is in contact with the external wall of the channel structure CH. Further, the data storing layer DS is in contact with an external wall of the tunnel insulating layer TI, and the blocking insulating layer BI is in contact with an external wall of the data storing layer DS. The tunnel insulating layer TI may be formed of an insulating material, in which tunneling is available, for example, a silicon oxide layer. The data storing layer DS may be formed of a material layer, in which charge trap is available, and for example, a silicon nitride layer. The blocking insulating layer BI may be formed of an insulating material, in which charge blocking is available, and include at least one of, for example, a silicon oxide layer and a high dielectric layer having a higher dielectric constant than that of a silicon oxide layer.

The conductive patterns CP may be electrically coupled to gates of the transistors included in the memory string. The conductive patterns CP include a select line electrically coupled to the select transistor and a word line electrically coupled to the memory transistor. A disposition of the select line and the word line may be various according to a design of the memory string. A particular example of the disposition of the select line and the word line will be described with reference to FIGS. 11 and 13 below.

Referring to FIGS. 2A to 2F, cross-sectional views for describing a method of manufacturing the semiconductor device according to an embodiment of the invention is shown.

Figure 2A:
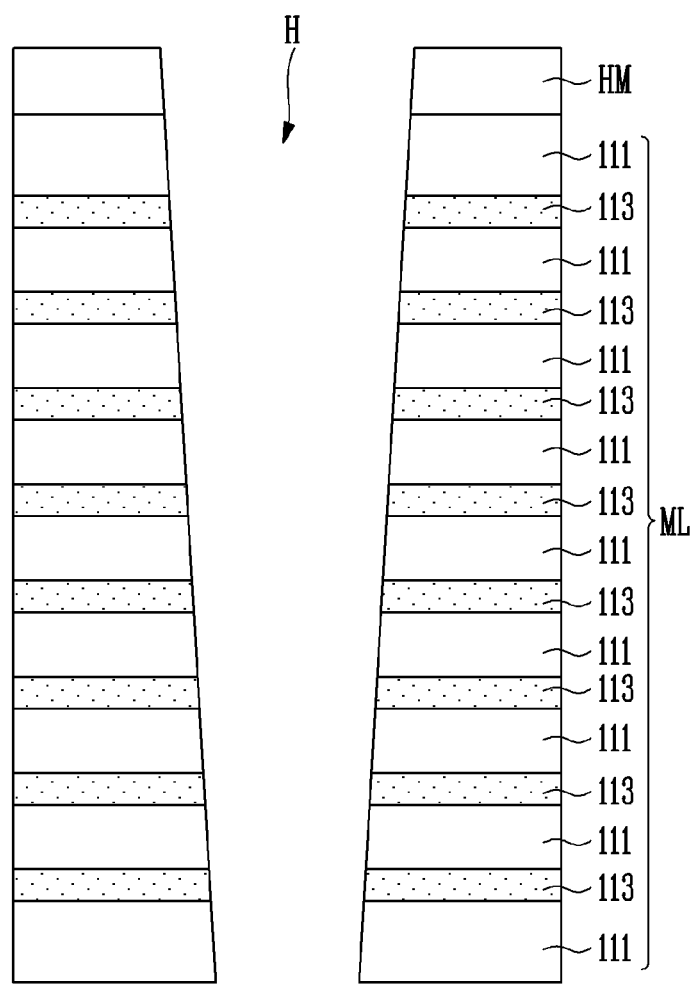

In FIG. 2A, a stack structure ML is formed by alternately stacking interlayer insulating layers 111 and sacrificial layers 113 each one layer on the substrate including the lower structure. The lower structure may include a source region. The source region may be formed by injecting an impurity into the substrate, or by forming a doped polysilicon layer on the substrate and then patterning the doped polysilicon layer. Otherwise, the lower structure may include a pipe gate including a pipe hole.

The interlayer insulating layers 111 may be formed of an oxide-based layer, such as a silicon oxide layer. The sacrificial layer 113 may be formed of a material having etch selectivity to the interlayer insulating layers 111. For example, the sacrificial layers 113 may be formed of a silicon nitride layer.

Next, a mask pattern HM for opening a partial region of the stack structure ML is formed on the stack structure ML. The mask pattern HM may be formed of a nitride layer. Then, a hole H passing through the stack structure ML is formed by etching the interlayer insulating layers 111 and the sacrificial layers 113 by an etch process using the mask pattern HM as an etch barrier. According to a characteristic of the etch process, a lateral wall of the hole H may be formed to be inclined at an angle larger than 90° with respect to the surface of the substrate.

Figure 2B:
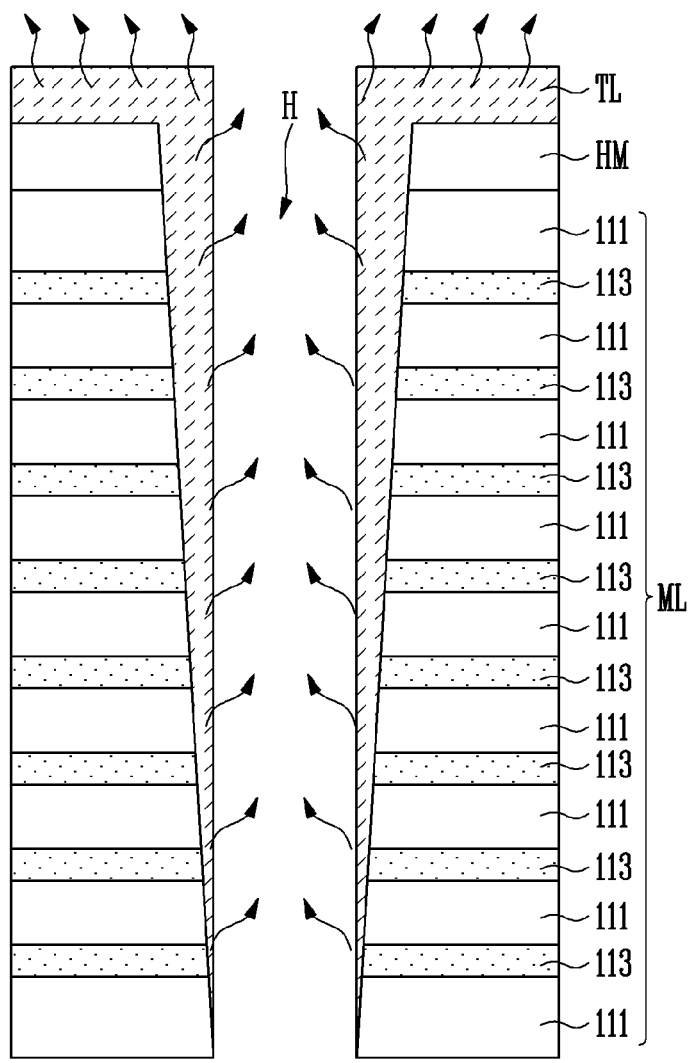

In FIG. 2B, a tapered layer TL having a width decreased toward a lower side heading the substrate is formed along an entire surface of an inclined lateral wall of the hole H. The tapered layer TL may be formed so that the width thereof is decreased toward the substrate by controlling a process condition of deposition equipment for depositing the tapered layer TL. The tapered layer TL may be formed by various methods, such as an Atomic Layer Deposition (ALD) method. The tapered layer TL may be formed of an oxide layer. The width of the tapered layer TL is decreased toward the substrate so that an inclination degree of an exposed lateral wall of the tapered layer TL may be close to 90° with respect to the surface of the substrate. Accordingly, the width of the hole H opened by the tapered layer TL may be uniform according to the height.

To improve density of the tapered layer TL, the tapered layer TL is annealed. Fluidity of the tapered layer TL may be decreased through annealing. In addition, a density of the tapered layer TL may be increased. The annealing may include furnace anneal, and be performed at a He gas atmosphere. The method of annealing is not limited to the aforementioned furnace anneal.

In the annealing operation, the density of the tapered layer TL may be controlled to be higher than a density of each of the sacrificial layers 113, and be lower than a density of each of the interlayer insulating layers 111. When the density of the tapered layer TL is higher than the density of each of the sacrificial layers 113, the tapered layer TL may be prevented from being lost in a subsequent process of removing the sacrificial layers 113, thereby preventing the memory layer M (see FIG. 1), particularly, the charge storing layer DS (see FIG. 1) from being damaged. When the density of the tapered layer TL is lower than the density of each of the interlayer insulating layers 111, it is possible to secure an insulating characteristic by decreasing a loss of thicknesses of the interlayer insulating layers 111 during a process of removing a partial region of the tapered layer TL.

Figure 2C:
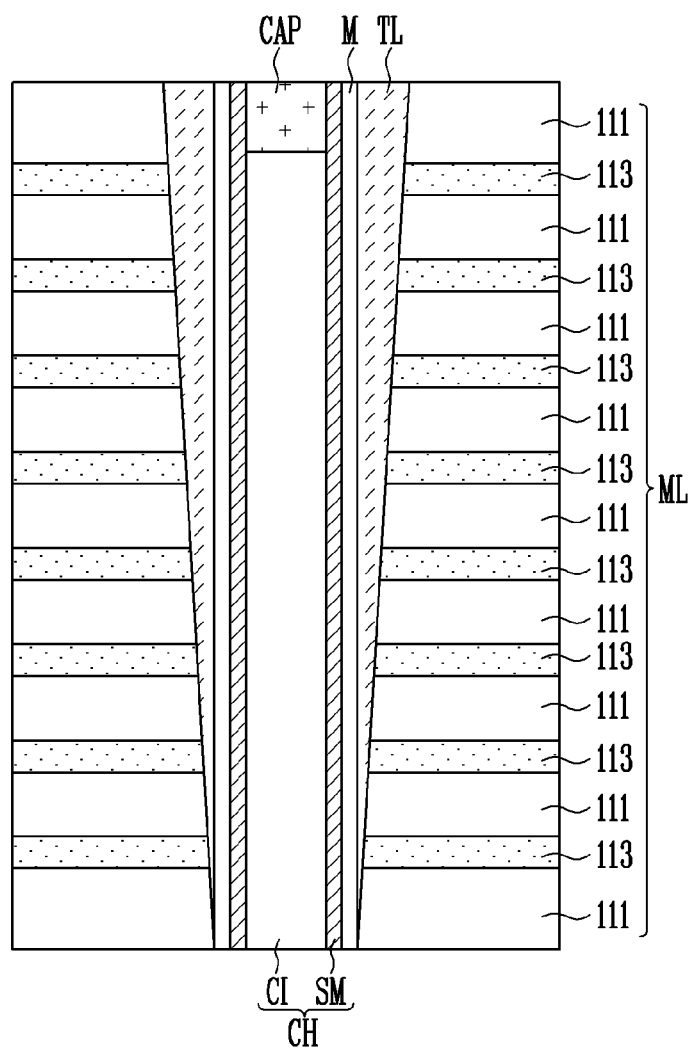

In FIG. 2C, the memory layer M may be formed along a surface of the annealed tapered layer TL. The memory layer M may include the blocking insulating layer BI, the data storing layer DS, and the tunnel insulating layer TI as described with reference to FIG. 1.

Next, the channel structure CH is formed inside the hole H. A process of forming the channel structure CH may include a process of forming the semiconductor layer SM along a surface of the memory layer M, a process of filling a center region of the hole H opened by the semiconductor layer SM with the core insulating layer CI, and a process of removing parts of the semiconductor layer SM and the core insulating layer CI disposed at an upper side of the stack structure ML by a planarizing process and the like. In this case, a partial region of the tapered layer TL and the mask pattern HM disposed at the upper side of the stack structure ML may be removed. The core insulating layer CI may be partially etched by an etch process to be formed with a smaller height than that of the semiconductor layer SM. The center region of the hole H opened on the core insulating layer CI may be filled with the capping layer CAP.

By contrast to the above description, the channel structure CH may be formed by completely embedding an inner part of the hole with the semiconductor layer SM.

The channel structure CH is formed inside the opened hole with the uniform width by the tapered layer TL so that the channel structure CH may be formed with a uniform width.

In FIG. 2D, a slit SL passing through the stack structure ML is formed. The slit SL may divide the interlayer insulating layers 111P in a unit of a memory block. The slit SL may expose lateral walls of the sacrificial layers 113 illustrated in FIG. 2C.

Next, first recess regions R1 are formed between the interlayer insulating layers 111P by removing the sacrificial layers 113 exposed by the slit SL. The tapered layer TL formed at a higher density than that of the sacrificial layers 113 is not removed and is left, thereby protecting the memory layer M. The first recess regions R1 expose partial regions of the tapered layer TL.

Figure 2E:
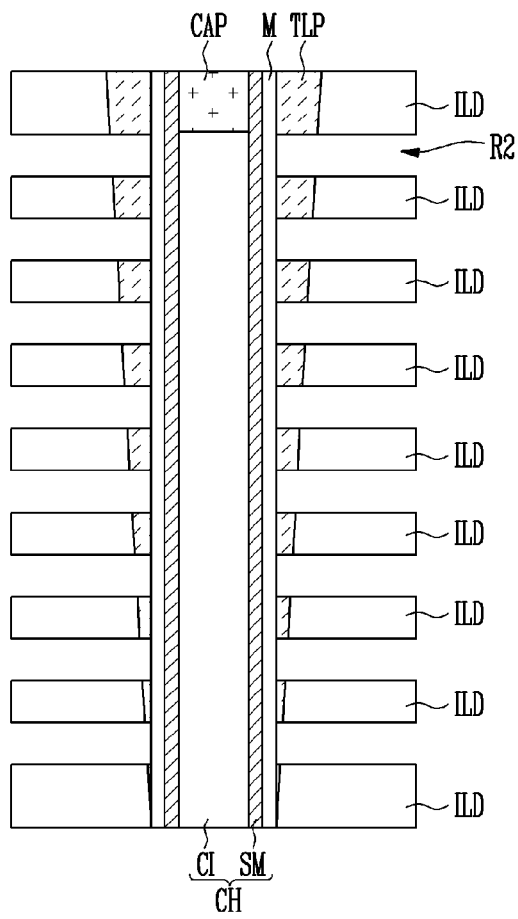

In FIG. 2E, second recess regions R2 exposing the memory layer M are formed by removing partial regions of the tapered layer TL exposed by the first recess regions R1. In this case, thicknesses of the interlayer insulating layers 111P illustrated in FIG. 2D are decreased, so that a thickness of the second recess regions R2 may be larger than a thickness of the first recess regions R1. The finally left interlayer insulating patterns ILD are spaced apart from each other with any one of the second recess regions R2 interposed therebetween. The interlayer insulating layers 111P have higher density than that of the tapered layer TL, so that the interlayer insulating layers 111P are more slowly etched than the tapered layer TL during the removal of the partial regions of the tapered layer TL. Accordingly, the interlayer insulating patterns ILD may be left with a thickness enough to secure an insulating characteristic. The tapered layer TL may be divided into the tapered patterns TLP by the second recess regions R2.

Figure 2F:
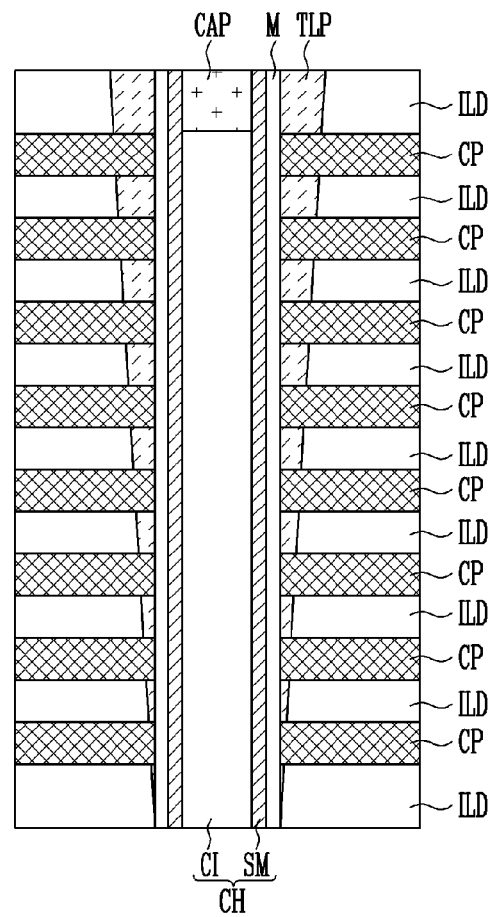

In FIG. 2F, the second recess regions R2 are filled with the conductive patterns CP. The conductive patterns CP may include at least one of a polysilicon, a metal silicide layer, and a metal layer. The conductive patterns CP may further include a metal barrier layer. Although not illustrated in the figure, a blocking insulating layer may be further formed before forming the conductive patterns CP. After the conductive patterns CP are formed, a subsequent process, such as filling the slit SL with an insulating layer, may be performed.

As described above, the conductive patterns CP may be extended up to regions between the tapered patterns TLP in which the tapered layer TL is removed. Further the conductive patterns CP may have lateral walls disposed on the same line as the lateral walls of the tapered patterns TLP adjacent to the channel structure CH. The conductive patterns CP may be formed to have the uniform width without an influence of the inclination degree of the hole.

Figure 3:
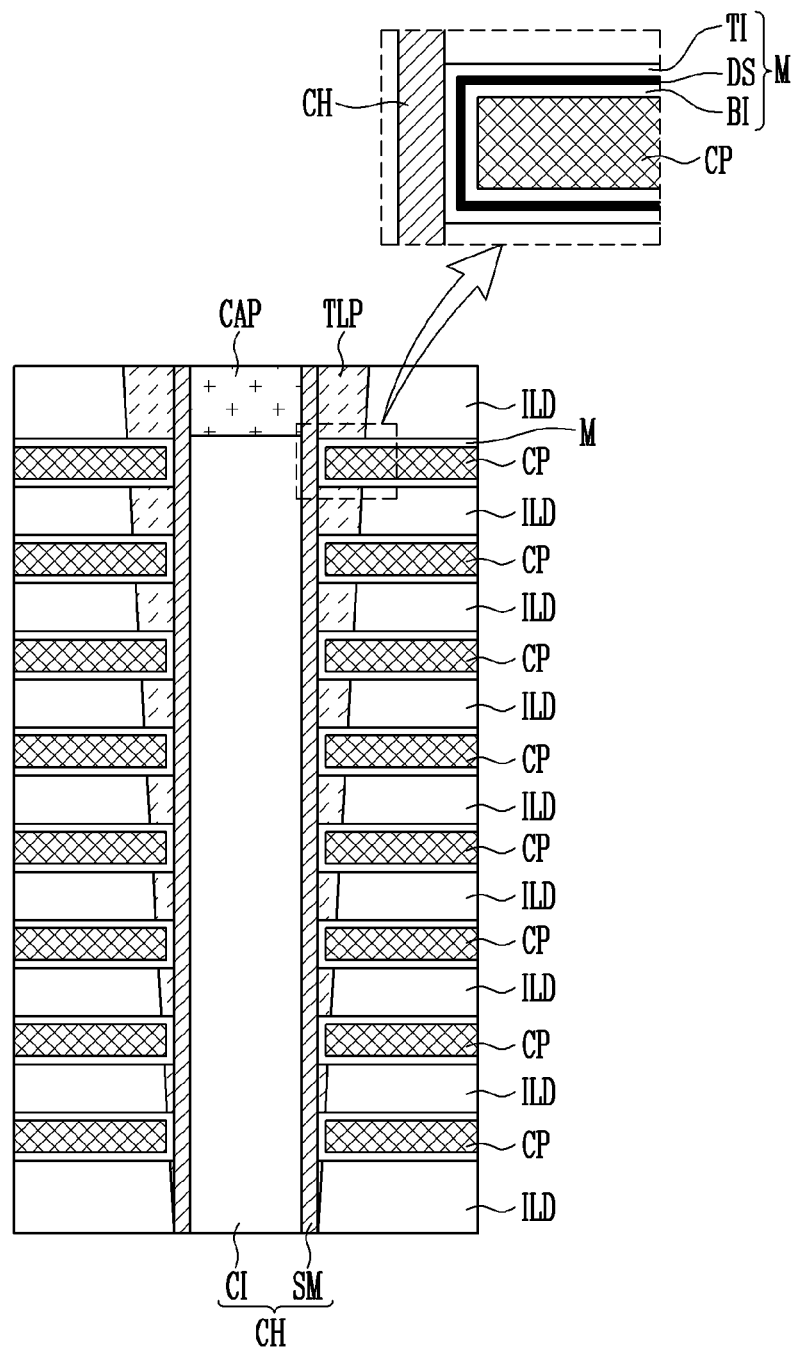
FIG. 3 is a cross-sectional view for describing a semiconductor device according to an embodiment of the invention.

Referring to FIG. 3, a cross-sectional view for describing a semiconductor device according to an embodiment of the invention is described.

As illustrated in FIG. 3, a semiconductor device according to an embodiment invention includes a channel structure CH formed on a substrate, and a memory string formed along the channel structure CH. The channel structure CH according to an embodiment of the invention is the same as that described with reference to FIG. 1.

The channel structure CH according to an embodiment of the invention may be surrounded by tapered patterns TLP. A film quality, a structure, and an effect of the tapered patterns TLP are the same as those described with reference to FIG. 1.

The tapered patterns TLP may be disposed with any one of the conductive patterns CP, which are passed through by the channel structure CH, interposed therebetween. The tapered patterns TLP may be divided by the conductive patterns CP. The conductive patterns CP are formed between the interlayer insulating patterns ILD passed through by the channel structure CH. The conductive patterns CP may be surrounded by a memory layer M having a C-shaped cross-sectional structure. The memory layer M may be disposed between the interlayer insulating patterns ILD, which are stacked while being spaced apart from each other, and be formed along surfaces of the interlayer insulating patterns ILD and the channel structure CH.

A film quality and a structure of the interlayer insulating patterns ILD are the same as those described with reference to FIG. 1.

The conductive patterns CP further protrude than the interlayer insulating patterns ILD toward the channel structure CH identically to the description of FIG. 1. Accordingly, in an embodiment of the invention, it is possible to decrease or remove a width difference between the conductive patterns CP formed on planes having different heights, so that it is possible to improve uniformity of the widths of the conductive patterns CP formed on the planes having different heights. When the widths of the conductive patterns CP are uniform, it is possible to decrease a difference in a program speed and an erase speed between the memory cell transistors electrically coupled to the conductive patterns CP. Accordingly, in an embodiment of the invention, it is possible to improve reliability of the operation of the semiconductor device. A function and a configuration of the conductive patterns CP are the same as those described with reference to FIG. 1.

The memory layer M may include a blocking insulating layer BI, a data storing layer DS, and a tunnel insulating layer TI. The tunnel insulating layer TI is in contact with the channel structure CH and the interlayer insulating patterns ILD. In addition, the data storing layer DS is formed along a surface of the tunnel insulating layer TI, and the blocking insulating layer BI is formed along a surface of the data storing layer DS. Layer qualities and functions of the tunnel insulating layer TI, the data storing layer DS, and the blocking insulating layer BI are the same as those described with reference to FIG. 1.

Figure 4A:
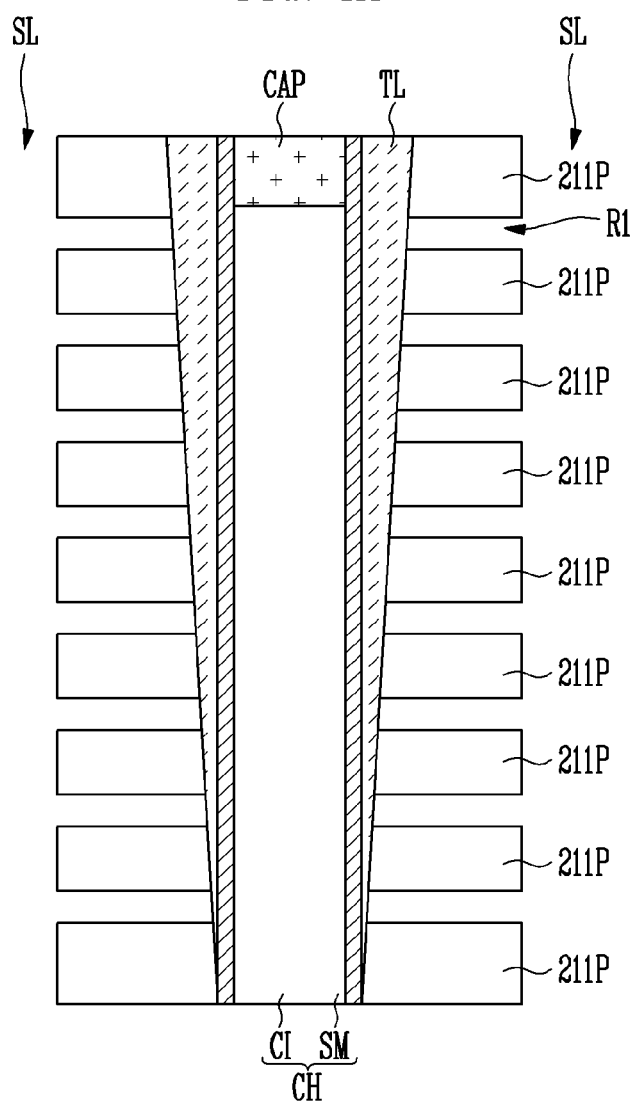
FIGS. 4A to 4C are cross-sectional views for describing a method of manufacturing the semiconductor device according to an embodiment of the invention.
Figure 4B:
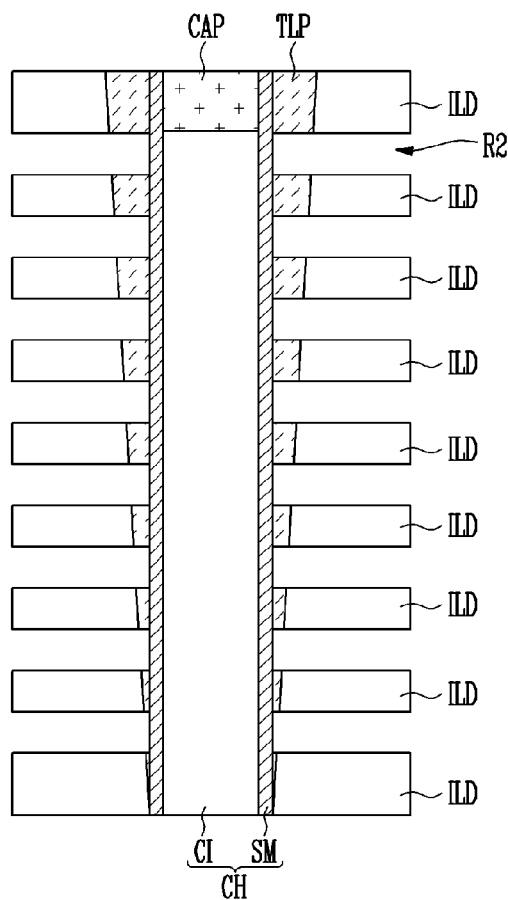
Figure 4C:
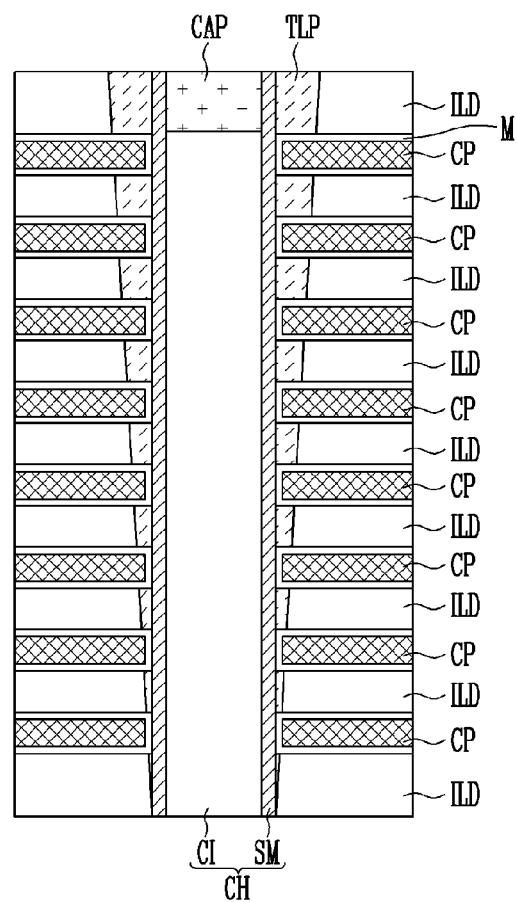

Referring to FIGS. 4A to 4C, cross-sectional views for describing a method of manufacturing the semiconductor device according to an embodiment of the invention is described.

In FIG. 4A, a process of forming the stack structure on the substrate including the lower structure, a process of forming the hole passing through the stack structure, and a process of forming the tapered layer TL along the lateral wall of the hole, and a process of annealing the tapered layer TL are sequentially performed. The processes are the same as that described with reference to FIGS. 2A and 2B.

Next, the channel structure CH and the capping layer CAP are formed inside the hole opened by the annealed tapered layer TL. The channel structure CH may include a core insulating layer CI and a semiconductor layer SM surrounding the core insulating layer CI. The channel structure CH and the capping layer CAP may be formed by the same method as described with reference to FIG. 2C.

Next, a slit SL passing through the stack structure is formed as described with reference to FIG. 2D, and then first recess regions R1 are formed between the interlayer insulating layers 211P by removing sacrificial layers exposed through the slit SL. The tapered layer TL having higher density than that of the sacrificial layers may not be removed to protect the channel structure CH.

In FIG. 4B, second recess regions R2 exposing the channel structure CH are formed by removing partial regions of the tapered layer TL exposed by the first recess regions R1. In this case, thicknesses of the interlayer insulating layers 211P illustrated in FIG. 4A are decreased, so that the thicknesses of the second recess regions R2 may be larger than thicknesses of the first recess regions R1. The finally left interlayer insulating patterns ILD are spaced apart from each other with any one of the second recess regions R2 interposed therebetween. The interlayer insulating layers 211P have higher density than that of the tapered layer TL, so that the interlayer insulating layers 211P are more slowly etched than the tapered layer TL during the removal of the partial regions of the tapered layer TL. Accordingly, the interlayer insulating patterns ILD may be left with a thickness enough to secure an insulating characteristic. The tapered layer TL may be divided into the tapered patterns TLP by the second recess regions R2.

In FIG. 4C, the memory layer M is formed along a surface of each of the second recess regions R2. The configuration of the memory layer M is the same as that described with reference to FIG. 3. Then, the conductive pattern CP filling each of the second recess regions R2 is formed on the memory layer M. The CP may be formed of the material described with reference to FIG. 2F.

As described above, the conductive patterns CP are extended up to the regions between the tapered patterns TLP, and accord with an inclination degree of the lateral walls of the tapered patterns TLP adjacent to the channel structure CH, so that the conductive patterns CP may be formed with an uniform width without an influence of an inclination degree of the hole.

Figure 5A:
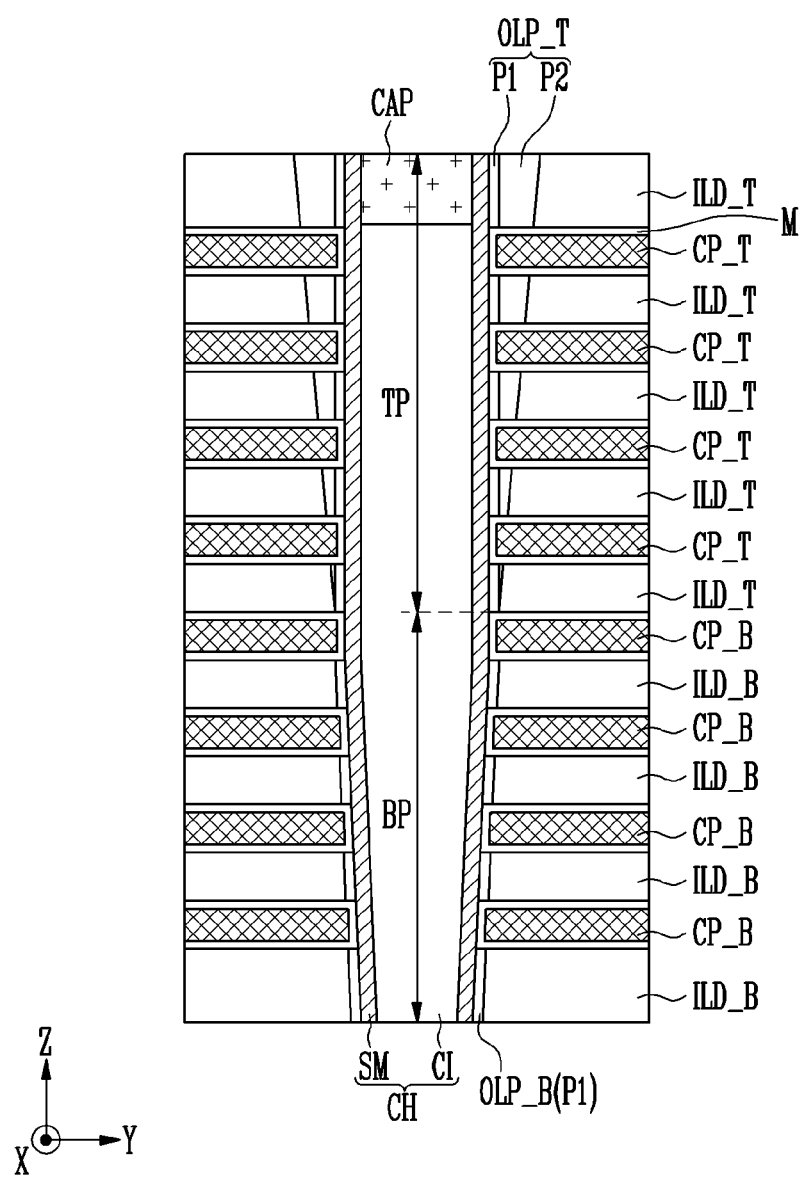
FIGS. 5A and 5B are cross-sectional views for describing a semiconductor device according to an embodiment of the invention.
Figure 5B:
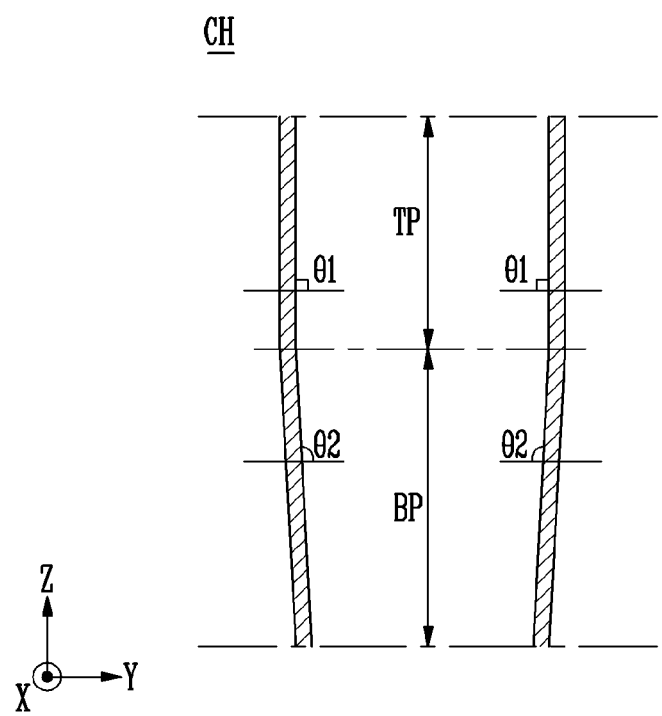

Referring to FIGS. 5A and 5B, cross-sectional views for describing a semiconductor device according to an embodiment of the invention is described.

As illustrated in FIG. 5A, a semiconductor device according to an embodiment of the invention includes a channel structure CH formed on a substrate, and a memory string formed along the channel structure CH. The memory string includes transistors formed along the channel structure CH. The transistors include a memory cell transistor and a select transistor.

The substrate may have various lower structures according to a design structure of the memory string. A particular example of the lower structure will be described with reference to FIGS. 11 and 13 below. The channel structure CH may be formed in various forms, such as a straight type, a U-shape, and a W-shape, according to the structure of the memory string. A particular example of the form of the channel structure CH will be described with reference to FIGS. 11 and 13 below.

The channel structure CH is formed while passing through interlayer insulating patterns ILD_T and ILD_B and conductive patterns CP_T and CP_B. The interlayer insulating patterns ILD_T and ILD_B and the conductive patterns CP_T and CP_B may be alternately stacked each layer. The interlayer insulating patterns ILD_T and ILD_B and the conductive patterns CP_T and CP_B may be disposed on planes which are vertical to a stack direction and parallel to each other. Hereinafter, for convenience of description, the stack direction of the interlayer insulating patterns ILD_T and ILD_B and the conductive patterns CP_T and CP_B is defined as a Z direction, and a plane, on which each of the interlayer insulating patterns ILD_T and ILD_B and the conductive patterns CP_T and CP_B is disposed, is defined as an XY plane parallel to a surface of the substrate.

The interlayer insulating patterns may include lower interlayer insulating patterns ILD_B which are stacked while being spaced apart from each other, and upper interlayer insulating patterns ILD_T which are stacked on the lower interlayer insulating patterns ILD_B while being spaced apart from each other. A width of each of the lower interlayer insulating patterns ILD_B and the upper interlayer insulating patterns ILD_T may be increased toward a lower side close to the substrate according to a characteristic of a manufacturing process. Further, a width of a lower pattern among the upper interlayer insulating patterns ILD_T may be larger than a width of an upper pattern disposed to be farther from the substrate than the lower pattern. Accordingly, a lateral wall of each of the lower interlayer insulating patterns ILD_B and the upper interlayer insulating patterns ILD_T may be formed to be inclined at an angle larger than 90° with respect to the surface of the substrate.

The conductive patterns may include lower conductive patterns CP_B interposed between the lower interlayer insulating patterns ILD_B and upper conductive patterns CP_T interposed between the upper interlayer insulating patterns ILD_T.

The channel structure CH may be surrounded by oxide layer patterns OLP_T and OLP_B which are stacked while being spaced apart from each other. The oxide layer patterns include upper oxide layer patterns OLP_T and lower oxide layer patterns OLP_B. The upper oxide layer patterns OLP_T are interposed between the upper interlayer insulating patterns ILD_T and the channel structure CH. The lower oxide layer patterns OLP_B are interposed between the lower interlayer insulating patterns ILD_B and the channel structure CH.

The upper oxide layer patterns OLP_T are spaced apart from each other with any one of the upper conductive patterns CP_T interposed therebetween. The upper oxide layer patterns OLP_T is formed in a tapered shape of which a width is decreased toward a lower side heading the substrate. The upper oxide layer patterns OLP_T is widened upward an upper side. A width of an upper pattern among the upper oxide layer patterns OLP_T is larger than a width of a lower pattern which is disposed to be closer to the substrate than the upper pattern. The lower oxide layer patterns OLP_B are spaced apart from each other with any one of the lower conductive patterns CP_B interposed therebetween. The lower oxide layer patterns OLP_B may be formed with the same width. The upper oxide layer patterns OLP_T and the lower oxide layer patterns OLP_B may include a first region P1 of an oxide layer formed through a radical oxidation process. The upper oxide layer patterns OLP_T may further include a second region P2 of the oxide layer formed through the radical oxidation process. More particularly, each of the upper oxide layer patterns OLP_T may include the second region P2 having the tapered shape, of which the width is decreased toward the lower side heading the substrate, and the first region P1 grown from the second region P2. For convenience of the description, a border of the first region P1 and the second region P2 is indicated, but an interface may not be formed between the first region P1 and the second region P2. The first region P1 of each of the upper oxide layer patterns OLP_T surrounds an upper region TP of the channel structure CH, and the second region P2 surrounds the upper region TP of the channel structure CH with the first region P1 interposed therebetween. The lower oxide layer patterns OLP_B surround a lower region BP of the channel structure CH.

To secure stability of a manufacturing process, the upper and lower interlayer insulating patterns ILD_T and ILD_B may be formed to have a denser film quality than that of the second region P2 of each of the upper oxide layer patterns OLP_T.

According to an embodiment of the invention, the upper oxide layer patterns OLP_T having the tapered shape, of which the width is decreased toward the substrate, are disposed on inclined lateral walls of the upper interlayer insulating patterns ILD_T, so that an inclination degree of a lateral walls of the upper region TP of the channel structure CH may be formed to be close to 90° with respect to the surface (XY plane) of the substrate.

The upper region TP of the channel structure CH is defined as a region passing through the upper conductive patterns CP_T and the upper interlayer insulating patterns ILD_T. Further, the lower region BP of the channel structure CH is defined as a region passing through the lower conductive patterns CP_B and the lower interlayer insulating patterns ILD_B. The upper oxide layer patterns OLP_T, of which widths are decreased toward a lower side, are disposed between the upper region TP of the channel structure CH and the upper conductive patterns CP_T so that inclination degrees of the lateral walls of the upper conductive patterns CP_T may become gentle. Accordingly, the upper region TP of the channel structure CH may have a lateral wall close to be vertical to the surface (XY plane) of the substrate, compared to the lower region BP of the channel structure CH.

In FIG. 5B, the upper region TP of the channel structure CH may have the lateral wall inclined at a first angle θ1 with respect to the surface (XY plane) of the substrate by the tapered shape of the upper oxide layer patterns OLP_T. The lower region BP of the channel structure CH has a lateral wall inclined at a second angle θ2 with respect to the surface (XY plane) of the substrate according to an inclination degree of the lateral walls of the lower interlayer insulating patterns ILD_B. The first angle θ1 is more vertical with respect to the surface (XY plane) of the substrate than the second angle θ2.

Referring back to FIG. 5A, in an embodiment of the invention, it is possible to decrease a width difference according to the height of the channel structure CH through the channel structure CH having the lateral wall inclined at the first angle θ1 close to vertical as described above. Accordingly, in an embodiment of the invention, it is possible to decrease a width difference of the channel structure CH according to the height of the channel structure CH, or it is possible to unify a thickness of the semiconductor layer SM of the channel structure CH. When the thickness of the semiconductor layer SM of the channel structure CH is uniform, operation stability of the semiconductor device is increased, thereby improving reliability of an operation of the semiconductor device.

The channel structure CH may include a tube-type semiconductor layer SM and a core insulating layer CI formed at a center region of the tube-type semiconductor layer SM as described with reference to FIG. 1. The core insulating layer CI may be formed lower than the tube-type semiconductor layer SM and a capping layer CAP surrounded by the tube-type semiconductor layer SM may be further formed on the core insulating layer CI as described with reference to FIG. 1. Although not illustrated in the figure, the channel structure CH may be formed of an embedded semiconductor layer as described with reference to FIG. 1.

The upper and lower conductive patterns CP_T and CP_B further protrude than the upper and lower interlayer insulating layers ILD_T and ILD_P toward the channel structure CH. Further, the upper conductive patterns CP_T may have lateral walls which do not accord with the inclination degree of the lateral walls of the upper interlayer insulating patterns ILD_T, and are disposed on the same line as that of the lateral walls of the upper oxide layer patterns OLP_T toward the channel structure CH. Accordingly, in an embodiment of the invention, it is possible to decrease a width difference between the upper conductive patterns CP_T formed on planes having different heights, so that it is possible to improve uniformity of the widths between the upper conductive patterns CP_T formed on the planes having different heights. Further, in an embodiment of the invention, it is possible to decrease a width difference between the upper conductive patterns CP_T and the lower conductive patterns CP_B. As described above, when the widths between the upper conductive patterns CP_T and the lower conductive patterns CP_B are uniform, it is possible to decrease a difference in a program speed and an erase speed between the memory cell transistors electrically coupled to the upper conductive patterns CP_T and the lower conductive patterns CP_B. Accordingly, in an embodiment of the invention, it is possible to improve reliability of the operation of the semiconductor device.

Each of the upper conductive patterns CP_T is disposed between the upper interlayer insulating patterns ILD_T which are stacked while being spaced apart from each other, and may be surrounded by the memory layer M formed along the surfaces of the upper interlayer insulating patterns ILD_T and the channel structure CH and has a C-shaped cross-sectional structure. Each of the lower conductive patterns CP_B is disposed between the lower interlayer insulating patterns ILD_B which are stacked while being spaced apart from each other, and may be surrounded by the memory layer M which is formed along the surfaces of the lower interlayer insulating patterns ILD_B and the channel structure CH and has a C-shaped cross-sectional structure. The memory layer M may be formed of a configuration described with reference to FIG. 3.

The upper and lower conductive patterns CP_T and CP_B may be electrically coupled to gates of the transistors included in the memory string. The upper and lower conductive patterns CP_T and CP_B include a select line electrically coupled to the select transistor and a word line electrically coupled to the memory transistor. A disposition of the select line and the word line may be various according to a design of the memory string. A particular example of the disposition of the select line and the word line will be described with reference to FIGS. 11 and 13 below.

Referring to FIGS. 6A to 6F, cross-sectional views for describing a method of manufacturing the semiconductor device according to an embodiment of the invention are described.

In FIG. 6A, a stack structure ML is formed by alternately stacking interlayer insulating layers 311B and 311T and sacrificial layers 313B and 313T each one layer on the substrate (not shown) including the lower structure. The lower structure is the same as that described with reference to FIG. 2A.

Material properties of the interlayer insulating layers 311B and 311T and the sacrificial layers 313B and 313T are the same as those described with reference to FIG. 2A.

Next, a mask pattern HM for opening a partial region of the stack structure ML is formed on the stack structure ML. The mask pattern HM may be formed of a nitride layer. Then, a hole H passing through the stack structure ML is formed by etching the interlayer insulating layers 311B and 311T and the sacrificial layers 313B and 313T by an etch process using the mask pattern HM as an etch barrier. According to a characteristic of the etch process, a lateral wall of the hole H may be formed to be inclined at an angle larger than 90° with respect to the surface of the substrate.

The tapered layer TL having a width decreased toward a lower side heading the substrate is formed along an inclined lateral wall of the hole H. The tapered layer TL opens a lower region of the hole H adjacent to the substrate, and is formed along an upper region of the hole H. The tapered layer TL having the aforementioned structure may be formed by controlling a processing condition of deposition equipment depositing the tapered layer TL. The tapered layer TL may be formed by various methods, such as an Atomic Layer Deposition (ALD) method. The tapered layer TL may be formed of an oxide layer or a nitride layer. The width of the tapered layer TL is decreased toward the substrate so that an inclination degree of an exposed lateral wall of the tapered layer TL may be close to 90° with respect to the surface of the substrate. Accordingly, a difference in a width between the upper region of the hole H opened by the tapered layer TL and the lower region of the hole H is decreased.

The interlayer insulating layers 311B and 311T may be divided into upper interlayer insulating layers 311T blocked by the tapered layer TL and lower interlayer insulating layers 311B opened by the tapered layer TL. Further, the sacrificial layers 313B and 313T may be divided into upper sacrificial layers 313T blocked by the tapered layer TL and lower sacrificial layers 313B opened by the tapered layer TL.

After the tapered layer TL is formed, the tapered layer TL is annealed to improve density of the tapered layer TL. An annealing method and an effect according to the annealing are the same as those described with reference to FIG. 2B.

Figure 6B:
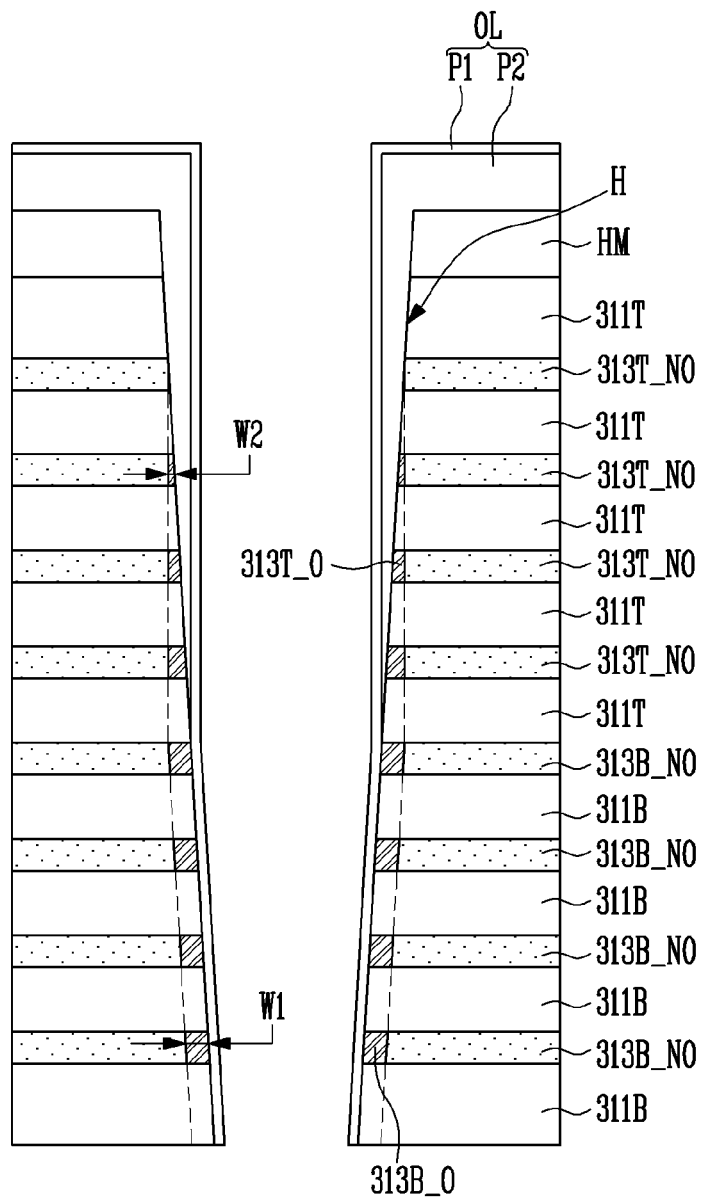

In FIG. 6B, the annealed tapered layer TL (see FIG. 6A) is oxidized by a radical oxidation method. During the radical oxidization process, oxygen radical may oxide the annealed tapered layer TL, and permeate from lateral walls of the upper interlayer insulating layers 311T (see FIG. 6A) and the upper sacrificial layers 313T (see FIG. 6A) adjacent to the annealed tapered layer TL into partial regions of the upper interlayer insulating layers 311T and the upper sacrificial layers 313T. Further, the oxygen radical may permeate from lateral walls of the lower interlayer insulating layers 311B (see FIG. 6A) and the lower sacrificial layers 313B (see FIG. 6A) opened by the annealed tapered layer TL into partial regions of the lower interlayer insulating layers 313T and the lower sacrificial layers 313B.

The oxygen radical permeates into the interlayer insulating layers 311T and 311B and the sacrificial layers 313T and 313B with different widths according to the heights of the interlayer insulating layers 311T and 311B and the sacrificial layers 313T and 313B as indicated by a dotted line of FIG. 6B. More particularly, the annealed tapered layer TL has high density, thereby disturbing permeation of the oxygen radical. Accordingly, the oxygen radical may permeate into the lower interlayer insulating layers 311B and the lower sacrificial layers 313B opened by the annealed tapered layer TL with larger widths than those of the upper interlayer insulating layers 311T and the upper sacrificial layers 313T blocked by the annealed tapered layer TL. A width of a region of oxygen radical permeation into the upper interlayer insulating layers 311T and the upper sacrificial layers 313T blocked by the annealed tapered layer TL is inverse proportion to a width of the annealed tapered layer TL. The annealed tapered layer TL has a tapered shape of which a width is decreased toward a lower side so that the width of the region of oxygen radical permeation into the upper interlayer insulating layers 311T and the upper sacrificial layers 313T blocked by the annealed tapered layer TL is increased toward the lower side heading the substrate. In the meantime, an oxide layer may be grown along the surface of the hole H by radical oxidation.

As a result of the radical oxidation, an oxide layer OL including the first region P1 and the second region P2 is formed. Further, the sacrificial layers 313T and 313B are divided into oxidized regions 313T_O and 313B_O and non-oxide regions 313T_NO and 313B_NO.

The first region P1 is defined as a region in which the oxide layer grown by the radical oxidation process is disposed. In addition, the second region P2 is defined as a region in which the tapered layer TL is oxidized. The oxide layer OL including the first region P1 and the second region P2 has a tapered shape by the second region P2 having the tapered shape. Accordingly, a difference in a width between the upper region and the lower region of the hole decreased by the tapered layer TL may be maintained by the oxide layer OL.

The widths of the oxide regions 313T_O of the upper sacrificial layers 313T are increased toward the lower sacrificial layers 313B. Further, the widths of the oxide regions 313B_O of the lower sacrificial layers 313B are larger than the widths of the oxide regions 313T_O of the upper sacrificial layers 313T. The lower sacrificial layers 313B are not blocked by the annealed tapered layer TL so that the lower sacrificial layers 313B may be oxidized with the same first width W1. Accordingly, the oxide regions 313B_O of the lower sacrificial layers 313B may have the first width W1. The upper sacrificial layers 313T are blocked by the annealed tapered layer TL so that the upper sacrificial layers 313T may be oxidized with smaller widths than those of the lower sacrificial layers 313B. Accordingly, the oxide regions 313T_O of the upper sacrificial layers 313T may have widths smaller than the first width W1. For example, an oxide region of a predetermined upper sacrificial layer may have a second width W2 smaller than the first width W1.

Figure 6C:
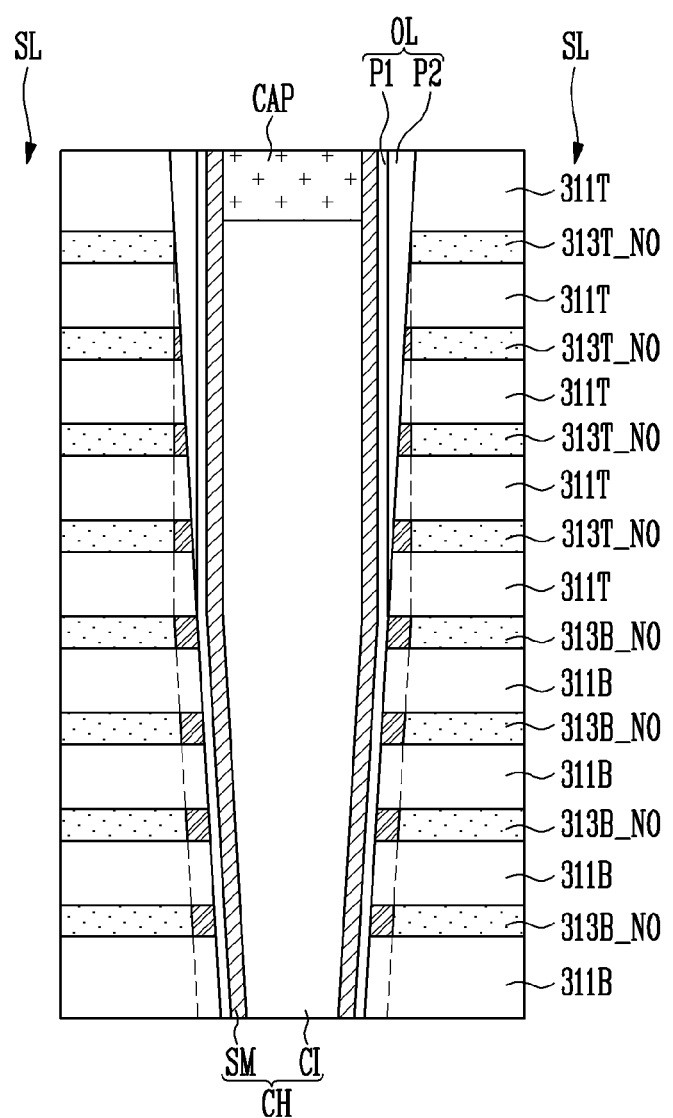

In FIG. 6C, the channel structure CH may be formed inside the hole opened by the oxide layer OL. A process of forming the channel structure CH may include a process of forming the semiconductor layer SM along a surface of the oxide layer OL, a process of filling a center region of the hole H opened by the semiconductor layer SM with the core insulating layer CI and a process of removing parts of the semiconductor layer SM and the core insulating layer CI disposed at an upper side of the stack structure ML by a planarizing process and the like. In this case, a partial region of the oxide layer OL and the mask pattern HM disposed at the upper side of the stack structure ML may be removed. The core insulating layer CI may be partially etched by an etch process to be formed with a smaller height than that of the semiconductor layer SM. The center region of the hole H opened on the core insulating layer CI may be filled with the capping layer CAP.

By contrast to the above description, the channel structure CH may be formed by completely embedding an inner part of the hole with the semiconductor layer SM.

The channel structure CH is formed in a state where a difference in a width between the upper region and the lower region of the hole is decreased by the oxide layer OL so that it is possible to improve uniformity of the width of the channel structure CH.

Next, a slit SL passing through the stack structure is formed. The slit SL passes through the interlayer insulating layers 311T and 311B and the non-oxide regions 313T_NO and 313B_NO of the sacrificial layers. The slit SL may divide the interlayer insulating layers 311T and 311B in a unit of a memory block. The slit may expose the non-oxide regions 313T_NO and 313B_NO of the sacrificial layers.

Figure 6D:
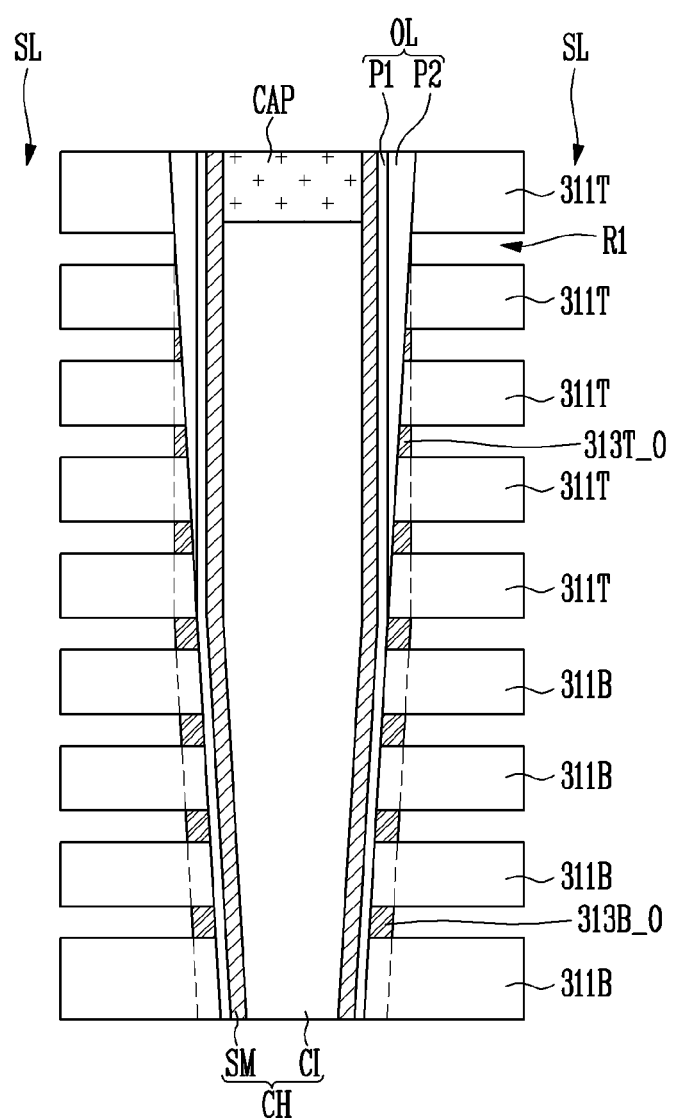

In FIG. 6D, the first recess regions R1 are formed between the interlayer insulating layers 311T and 311B by removing the non-oxide regions 313T_NO and 313B_NO of the sacrificial layers. Accordingly, the second region P2 of the oxide layer OL and the non-oxide regions 313T_NO and 313B_NO of the sacrificial layers are exposed.

Figure 6E:
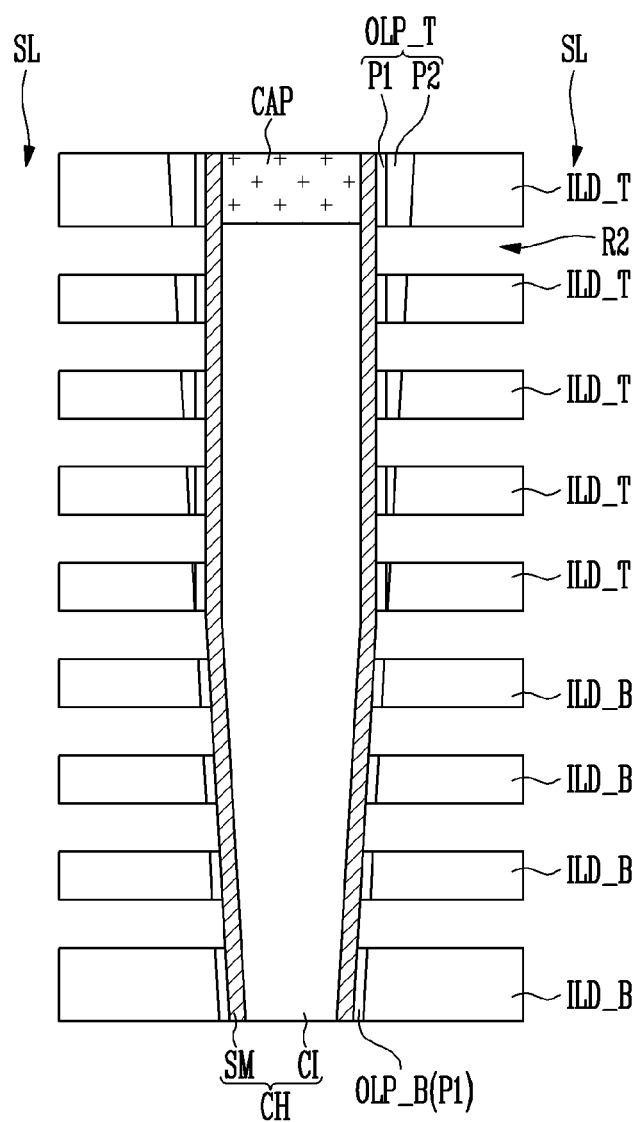

In FIG. 6E, the second recess regions R2 exposing the channel structure CH are formed by removing the non-oxide regions 313T_NO and 313B_NO of the sacrificial layers and partial regions of the oxide layer OL. Thicknesses of the interlayer insulating layers 311T and 311B illustrated in FIG. 6D are decreased, so that a thickness of the second recess regions R2 may be larger than a thickness of the first recess regions R1. The oxide layer OL may be divided into the upper oxide layer patterns OLP_T and the lower oxide layer patterns OLP_B by the second recess regions R2. Each of the upper oxide layer patterns OLP-T may be formed in the tapered shape. The lower oxide layer patterns OLP_B may be formed with a uniform thickness. The interlayer insulating patterns ILD_T and ILD_B, which are spaced apart from each other with any one of the second recess regions R2 interposed therebetween, may be divided into the upper interlayer insulating patterns ILD_T which are in contact with the upper oxide layer patterns OLP_T and the lower interlayer insulating patterns ILD_B which are in contact with the lower oxide layer patterns OLP_B.

Figure 6F:
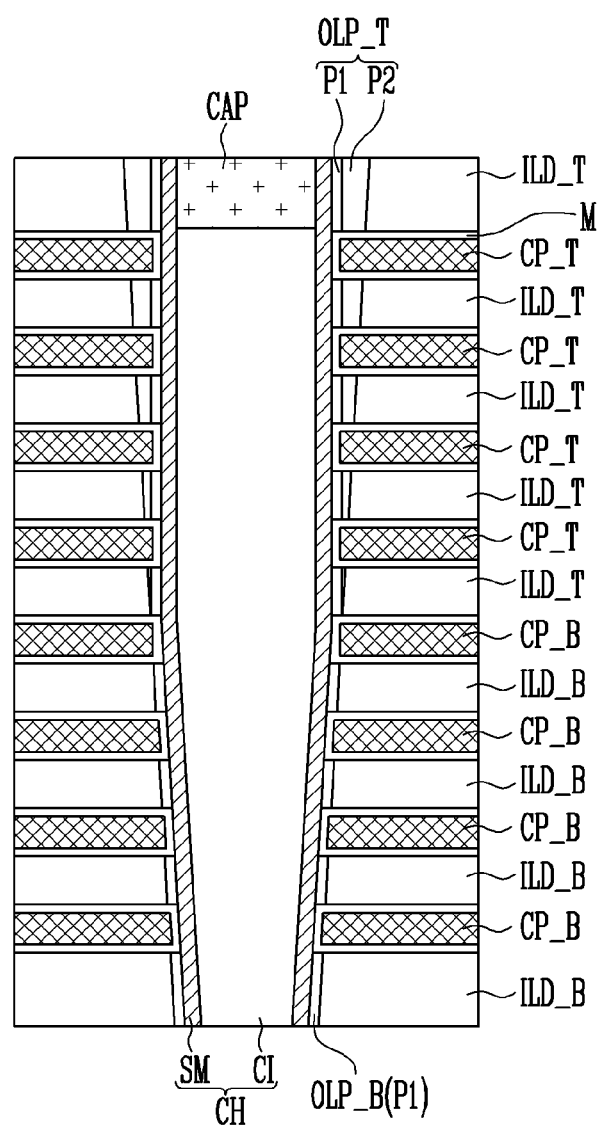

In FIG. 6F, the memory layer M is formed on a surface of each of the second recess regions R2. The configuration of the memory layer M is the same as that described with reference to FIG. 3. Then, the upper and lower conductive patterns CP_T and CP_B filling the second recess regions R2 are formed on the memory layer M. The upper and lower conductive patterns CP_T and CP_B may be formed of the material described with reference to FIG. 2F.

The upper conductive patterns CP_T are formed to be extended up to the regions between the upper oxide layer patterns OLP_T. Further, the upper conductive patterns CP_T may have lateral walls disposed on the same lines as those of the lateral walls of the upper oxide layer patterns OLP_T adjacent to the channel structure CH. The upper conductive patterns CP_T may be formed to have the uniform width without an influence of the inclination degree of the hole.

Figure 7:
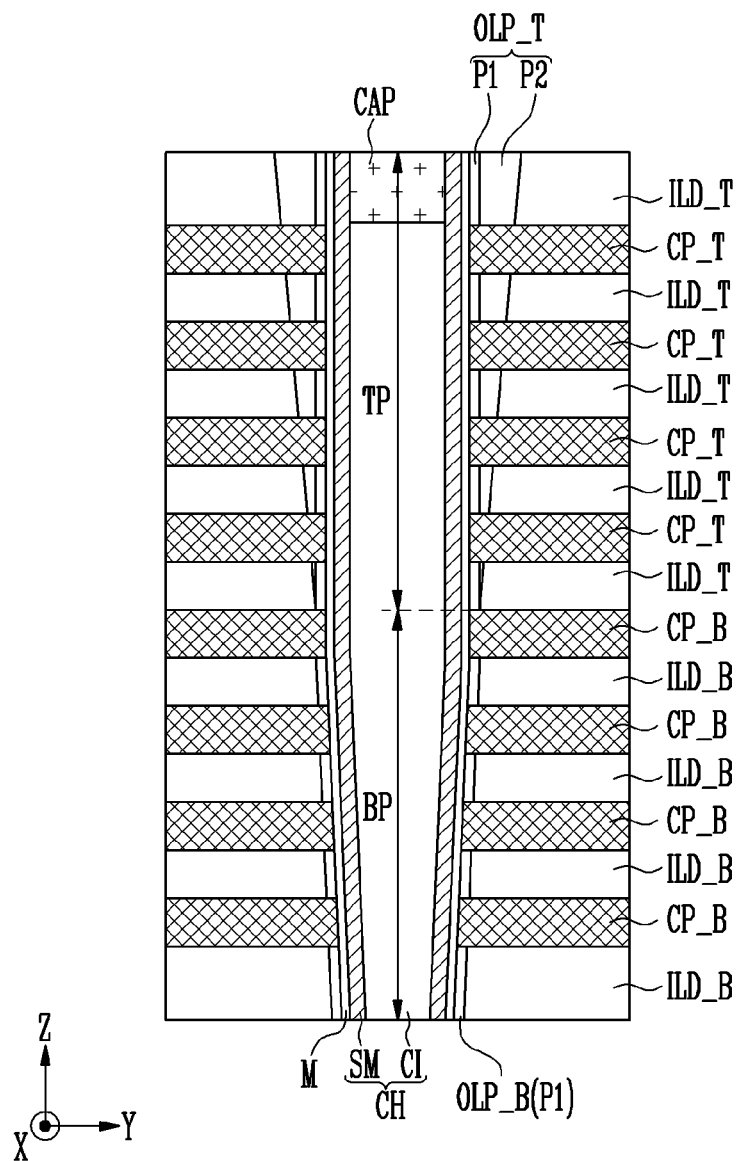
FIG. 7 is a cross-sectional view for describing a semiconductor device according to an embodiment of the invention.

Referring to FIG. 7, a cross-sectional view for describing a semiconductor device according to an embodiment of the invention is described.

As illustrated in FIG. 7, a semiconductor device according to an embodiment of the invention includes a channel structure CH formed on a substrate, and a memory string formed along the channel structure CH.

The channel structure CH according to an embodiment of the invention may be formed while passing through lower interlayer insulating patterns ILD_B, lower conductive patterns CP_B, upper interlayer insulating patterns ILD_T, and upper conductive patterns CP_T as described with reference to FIG. 5A. The structures of the lower interlayer insulating patterns ILD_B, the lower conductive patterns CP_B, the upper interlayer insulating patterns ILD_T, and the upper conductive patterns CP_T are the same as those described with reference to FIG. 5A.

The channel structure CH may be divided into an upper region TP and a lower region BP as described with reference to FIGS. 5A and 5B. Inclination degrees of lateral walls of the upper region TP and the lower region BP of the channel structure CH are the same as those described with reference to FIG. 5B.

The channel structure CH may be surrounded by oxide layer patterns OLP_T and OLP_B stacked while being spaced apart from each other. The oxide layer patterns include upper oxide layer patterns OLP_T and lower oxide layer patterns OLP_B. Structures of the upper oxide layer patterns OLP_T and the lower oxide layer patterns OLP_B, and an effect according to the structures are the same as those described with reference to FIG. 5A. Reference number P1 illustrated in FIG. 7 is the first region described with reference to FIG. 5A. Further, reference number P2 is the second region described with reference to FIG. 5A.

A memory layer M may be formed along an external wall of the channel structure CH. The memory layer M may surround the channel structure CH along spaces between the upper and lower oxide layer patterns OLP_T and OLP_B and the channel structure CH and spaces between the upper and lower conductive patterns CP_T and CP_B and the channel structure CH. The memory layer M may include the configuration described with reference to FIG. 1.

Film qualities and structures of the upper and lower interlayer insulating patterns ILD_T and ILD_B are the same as those described with reference to FIG. 5A.

Structures and functions of the upper and lower conductive patterns CP_T and CP_B are the same as those described with reference to FIG. 5A.

To manufacture the semiconductor device according to an embodiment of the invention, first, the processes described with reference to FIGS. 6A and 6B are performed. Then, the memory layer M is formed along a surface of an oxide layer OL is formed. The channel structure CH and a capping layer CAP descried with reference to FIG. 6C are formed inside a hole opened by the memory layer M.

Next, the processes described with reference to FIGS. 6D and 6E are performed, and the upper and lower conductive patterns CP_T and CP_B are formed inside second recess regions. The upper and lower conductive patterns CP_T and CP_B may be formed of the material described with reference to FIG. 2F. A blocking insulating layer may be additionally formed along surfaces of the second recess regions before the upper and lower conductive patterns CP_T and CP_B are formed.

The upper conductive patterns CP_T are formed to be extended up to the regions between the upper oxide layer patterns OLP_T. Further, the upper conductive patterns CP_T may have lateral walls disposed on the same lines as those of the lateral walls of the upper oxide layer patterns OLP_T adjacent to the channel structure CH. The upper conductive patterns CP_T may be formed to have a uniform width without an influence of an inclination degree of the hole.

Figure 8:
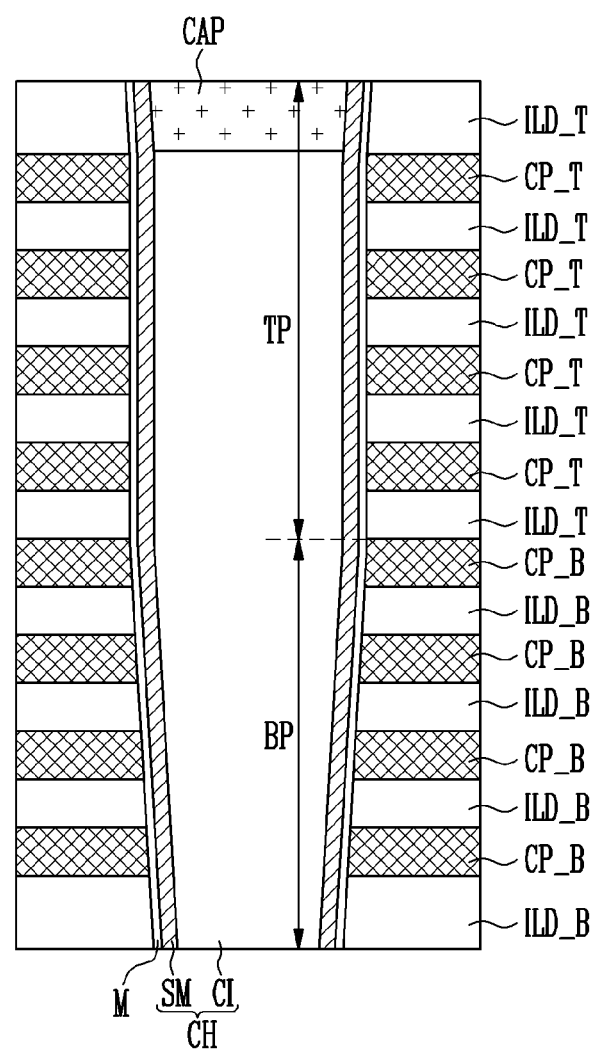
FIG. 8 is a cross-sectional view for describing a semiconductor device according to an embodiment of the invention.

Referring to FIG. 8, a cross-sectional view for describing a semiconductor device according to an embodiment of the invention is described.

As illustrated in FIG. 8, a semiconductor device according to an embodiment of the invention includes a channel structure CH formed on a substrate, and a memory string formed along the channel structure CH. The memory string includes transistors formed along the channel structure CH. The transistors include a memory cell transistor and a select transistor.

The substrate may have various lower structures according to a design structure of the memory string. A particular example of the lower structure will be described with reference to FIGS. 11 and 13 below. The channel structure CH may be formed in various forms, such as a straight type, a U-shape, and a W-shape, according to the structure of the memory string. A particular example of the form of the channel structure CH will be described with reference to FIGS. 11 and 13 below.

The channel structure CH may be divided into a lower region BP adjacent to the substrate and an upper region TP disposed on the lower region BP. The upper region TP and the lower region BP may be divided according to a difference in an inclination degree with respect to the surface of the substrate. More particularly, the upper region TP may have a lateral wall formed to be more closely vertical with respect to the surface of the substrate than the lower region BP. Accordingly, in an embodiment of the invention, it is possible to decrease a width difference of the channel structure CH according to a height of the channel structure CH.

The channel structure CH may include a tube-type semiconductor layer SM and a core insulating layer CI formed at a center area of the tube-type semiconductor layer SM as described with reference to FIG. 1. The core insulating layer CI may be formed to be lower than the tube-type semiconductor layer SM. Further, a capping layer CAP surrounded by the tube-type semiconductor layer SM may be further formed on the core insulating layer CI as described with reference to FIG. 1. Although not illustrated in the figure, the channel structure CH may be formed of an embedded semiconductor layer as described with reference to FIG. 1.

The channel structure CH may be surrounded by the memory layer M. The memory layer M may be formed so as to surround the channel structure CH along an external wall of the channel structure CH. The memory layer M may include the configuration described with reference to FIG. 1.

The channel structure CH surrounded by the memory layer M is formed while passing through interlayer insulating patterns ILD_T and ILD_B and conductive patterns CP_T and CP_B. The interlayer insulating patterns ILD_T and ILD_B and the conductive patterns CP_T and CP_B may be alternately stacked each layer. The interlayer insulating patterns ILD_T and ILD_B and the conductive patterns CP_T and CP_B may be disposed on planes vertical to a stack direction. Hereinafter, for convenience of description, the stack direction of the interlayer insulating patterns ILD_T and ILD_B and the conductive patterns CP_T and CP_B is defined as a Z direction. In addition, a plane, on which each of the interlayer insulating patterns ILD_T and ILD_B and the conductive patterns CP_T and CP_B is disposed, is defined as an XY plane parallel to a surface of the substrate.

The interlayer insulating patterns may include lower interlayer insulating patterns ILD_B which are stacked while being spaced apart from each other and upper interlayer insulating patterns ILD_T which are stacked on the lower interlayer insulating patterns ILD_B while being spaced apart from each other. A width of each of the lower interlayer insulating patterns ILD_B may be increased toward a lower side according to a characteristic of a manufacturing process. Accordingly, a lateral wall of each of the lower interlayer insulating patterns ILD_B may be formed to be inclined at an angle larger than 90° with respect to the surface (XY plane) of the substrate. Each of the upper interlayer insulating patterns ILD_T may be uniformly formed according to the characteristic of the manufacturing process, compared to the lower interlayer insulating patterns ILD_B. In particular, the lateral wall of each of the upper interlayer insulating patterns ILD_T may have an inclination degree close to 90° with respect to the surface (XY plane) of the substrate, compared to the lateral wall of each of the lower interlayer insulating patterns ILD_B. Each of the upper interlayer insulating patterns ILD_T may be formed with the same width.

The conductive patterns may include lower conductive patterns CP_B interposed between the lower interlayer insulating patterns ILD_B and upper conductive patterns CP_T interposed between the upper interlayer insulating patterns ILD_T.

The upper region TP of the channel structure CH is defined as a region passing through the upper conductive patterns CP_T and the upper interlayer insulating patterns ILD_T. Further, the lower region BP of the channel structure CH is defined as a region passing through the lower conductive patterns CP_B and the lower interlayer insulating patterns ILD_B.

The lateral walls of the upper interlayer insulating patterns ILD_T according to an embodiment of the invention define an inclination degree of the lateral wall of the upper region TP of the channel structure CH. Further, the lateral walls of the lower interlayer insulating patterns ILD_B define an inclination degree of the lateral wall of the lower region TP of the channel structure CH. Accordingly, the upper region TP of the channel structure CH may have the lateral wall close to be vertical to the surface (XY plane) of the substrate, compared to the lower region BP of the channel structure CH. Accordingly, in an embodiment of the invention, a width difference between the upper region TP and the lower region BP of the channel structure CH is decreased, so that it is possible to improve uniformity of a width of the channel structure CH according to the height of the channel structure CH.

The upper and lower conductive patterns CP_T and CP_B may be formed to be in contact with the memory layer M toward the channel structure CH of which a width difference according to a height thereof is decreased. The upper and lower conductive patterns CP_T and CP_B may be formed to be in contact with the memory layer M, which follows the inclination degree of the channel structure CH toward the channel structure CH of which a width difference according to a height thereof is decreased. Accordingly, a width difference between the upper and lower conductive patterns CP_T and CP_B according to the heights of the upper and lower conductive patterns CP_T and CP_B is decreased, so that it is possible to decrease a difference in a program speed and an erase speed between the memory cell transistors electrically coupled to the upper and lower conductive patterns CP_T and CP_B. Accordingly, in an embodiment of the invention, it is possible to improve reliability of an operation of the semiconductor device.

Figure 9A:
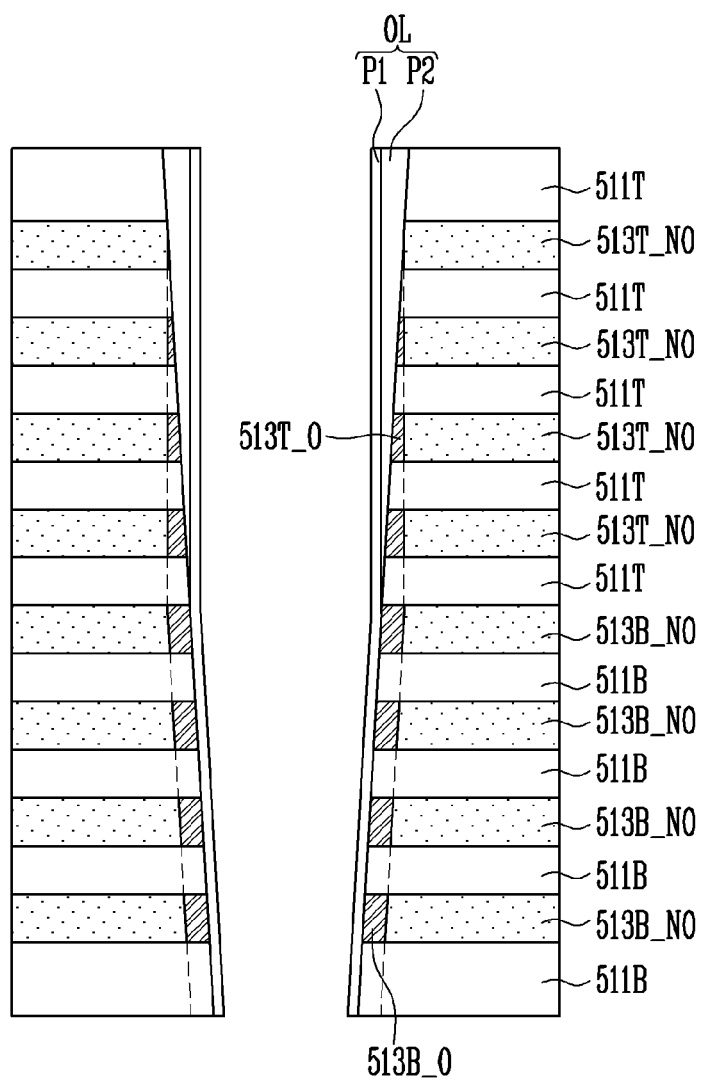
Figure 9B:
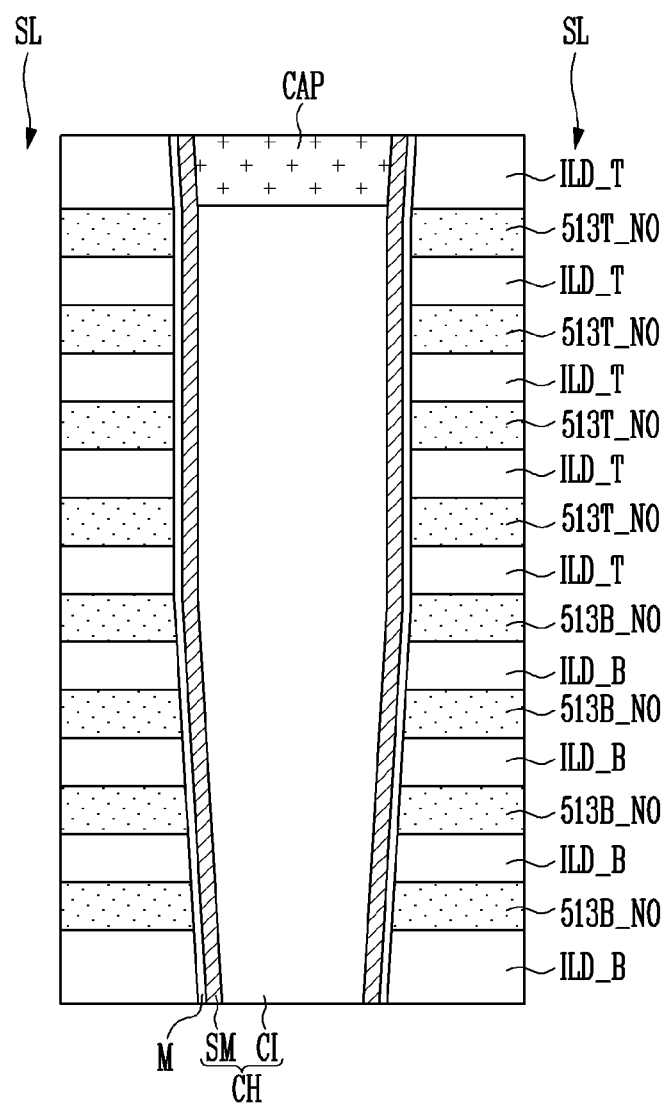

Referring to FIGS. 9A to 9C, cross-sectional views for describing a method of manufacturing the semiconductor device according to an embodiment of the invention are described.

In FIG. 9A, a stack structure ML is formed by alternately stacking interlayer insulating layers 511B and 511T and sacrificial layers each one layer on a substrate including a lower structure. Material properties of the interlayer insulating layers 511B and 511T and the sacrificial layers are the same as those described with reference to FIG. 2A.

Next, a hole passing through the stack is formed. Further, a tapered layer is formed along a lateral wall of an upper portion of the hole by the same method as that described with reference to FIG. 6A. Then, the tapered layer is annealed in order to increase density of the tapered layer by the same method as that described with reference to FIG. 6A.

Next, the annealed tapered layer and the sacrificial layer are oxidized by the same radical oxidation method as that described with reference to FIG. 6A. As a result, an oxide layer OL including a first region P1 and a second region P2 is formed as described with reference to FIG. 6B. In addition, the sacrificial layers are divided into oxide regions 513T_O and 513B_O and non-oxide regions 513T_NO and 513B_NO. A dotted line illustrated in FIG. 9A indicates a region into which oxygen radical permeates during the radical oxidation process.

The first region P1 is defined as a region in which an oxide layer grown by the radical oxidation process is disposed, and the second region P2 is defined as a region in which the tapered layer is oxidized. The oxide layer OL including the first region P1 and the second region P2 has a tapered shape by the second region P2 having the tapered shapes. Accordingly, a difference in a width between the upper region and the lower region of the hole decreased by the tapered layer TL may be maintained by the oxide layer OL.

Widths of the oxide regions 513T_O of the upper sacrificial layers are increased toward the lower sacrificial layers. In addition, widths of the oxide regions 513B_O of the lower sacrificial layers are larger than the widths of the oxide regions 513T_O of the upper sacrificial layers.

In FIG. 9B, the oxide layer OL described with reference to FIG. 9A is removed. In this case, partial regions of the interlayer insulating layers 511T and 511B formed based on an oxide may be removed by an etch material. In this case, the etch material may permeate from a surface of the oxide layer OL into the interlayer insulating layers 511T and 511B by a predetermined width. The width of the oxide layer OL is decreased toward the lower side, the width of the etch material permeation region within the interlayer insulating layers 511T and 511B may be varied according to a height as indicated by the dotted line of FIG. 9A. The width of the hole may be increased toward the lower side according to a result of the etch process. Further, an inclination degree of the lateral wall of the upper region of the hole may be close to 90°, compared to an inclination degree of the lateral wall of the lower region. In addition, a difference in a width between the upper region and the lower region of the hole is decreased. The upper region of the hole has the lateral wall defined by the lateral walls of the upper interlayer insulating patterns ILD_T and the lateral walls of the non-oxide regions 513T_NO of the upper sacrificial layer left as the result of the etch process. The lower region of the hole has the lateral wall defined by the lateral walls of the lower interlayer insulating patterns ILD_B and the lateral walls of the non-oxide regions 513B_NO of the lower sacrificial layer left as the result of the etch process.

A memory layer M is formed along a surface of the hole of which the width is increased. In addition, a channel structure CH and a capping layer CAP are formed inside the hole exposed by the memory layer M. The channel structure CH may include a semiconductor layer SM and a core insulating layer CI. In this case, the semiconductor layer SM is formed along the surface of the hole of which the width is increased, so that the semiconductor layer SM may be formed with a large thickness. When the thickness of the semiconductor layer SM is increased, it is possible to increase a cell current, thereby improving reliability of an operation of the semiconductor device. The configurations of the memory layer M and the channel structure CH are the same as that described with reference to FIG. 1.

Next, a slit SL passing through the interlayer insulating layers 511T and 511B and the non-oxide regions 515T_NO and 513B_NO of the sacrificial layers is formed. The slit SL may divide the lower interlayer insulating patterns ILD_B and the upper interlayer insulating patterns ILD_T in a unit of a memory block. The slit may expose the non-oxide regions 513T_NO and 513B_NO of the sacrificial layers.

In FIG. 9C, recess regions are formed by removing the non-oxide regions 513T_NO and 513B_NO of the sacrificial layers exposed by the slit SL. Then, upper and lower conductive patterns CP_T and CP_B are formed inside the recess regions. The upper and lower conductive patterns CP_T and CP_B may be formed of the material described with reference to FIG. 2F. A blocking insulating layer may be additionally formed along surfaces of the recess regions before the upper and lower conductive patterns CP_T and CP_B are formed.

As described above, the upper and lower conductive patterns CP_T and CP_B are formed to be in contact with the memory layer M, which follows the inclination degree of the channel structure CH toward the channel structure CH of which a width difference according to a height thereof is decreased. Accordingly, a difference in a width between the upper and lower conductive patterns CP_T and CP_B according to the heights of the upper and lower conductive patterns CP_T and CP_B may be decreased.

Figure 10:
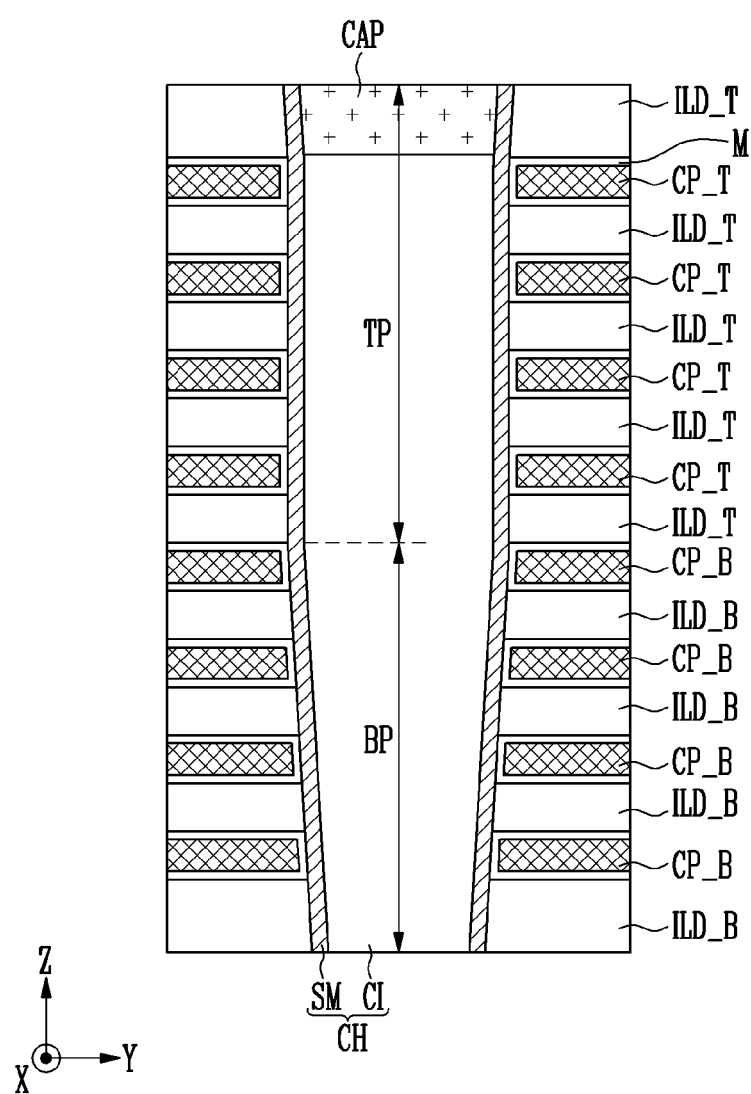
FIG. 10 is a cross-sectional view for describing a semiconductor device according to an embodiment of the invention.

Referring to FIG. 10, a cross-sectional view for describing a semiconductor device according to an embodiment of the invention is described.

In FIG. 10, a semiconductor device according to an embodiment of the invention includes a channel structure CH including a lower region BP and an upper region TP divided based on an inclination degree similar to an embodiment of the invention illustrated in FIG. 8. An effect according to an inclination degree of the channel structure CH is the same as that described with reference to FIG. 8.

The channel structure CH may include a tube-type semiconductor layer SM and a core insulating layer CI formed at a center region of the tube-type semiconductor layer SM as described with reference to FIG. 1. The core insulating layer CI may be formed to be lower than the tube-type semiconductor layer SM. Further, a capping layer CAP surrounded by the tube-type semiconductor layer SM may be further formed on the core insulating layer CI as described with reference to FIG. 1. Although not illustrated in the figure, the channel structure CH may be formed of an embedded semiconductor layer as described with reference to FIG. 1.

The channel structure CH is formed while passing through upper and lower interlayer insulating patterns ILD_T and ILD_B and upper and lower conductive patterns CP_T and CP_B identically to an embodiment of the invention. Each of the upper and lower interlayer insulating patterns ILD_T and ILD_B may be surrounded by the memory layer M. The memory layer M may have the configuration described with reference to FIG. 3.

To manufacture the semiconductor device according to an embodiment of the invention, first, an oxide layer formed in a tapered shape is formed, and partial regions of sacrificial layers are oxidized by performing the same process as that described with reference to FIG. 9A. Next, as described with reference to FIG. 9B, the oxide layer, oxide regions of the sacrificial layers, and partial regions of the interlayer insulating layers are removed as described with reference to FIG.

9B. Accordingly, a hole is expanded with different widths according to a height thereof, and a difference in a width between a lower region and an upper region of the hole is decreased. Then, the channel structure CH and the capping layer CAP are formed inside the hole of which the difference in the width between the lower region and the upper region of the hole is decreased. In this case, the semiconductor layer SM of the channel structure CH is formed along a surface of the hole of which the width is increased, so that the semiconductor layer SM may be formed with a large thickness. When the thickness of the semiconductor layer SM is increased, it is possible to increase a cell current, thereby improving reliability of an operation of the semiconductor device.

Next, a slit SL is formed identically to that described with reference to FIG. 9B, and then, recess regions are formed identically to those described with reference to FIG. 9C. Then, the memory layer M is formed along a surface of each of the recess regions, and the upper and lower conductive patterns CP_T and CP_B filling the recess regions are formed on the memory layer M. The upper and lower conductive patterns CP_T and CP_B may be formed of the material described with reference to FIG. 2F.

As described above, the upper and lower conductive patterns CP_T and CP_B are formed to be in contact with the memory layer M, which follows the inclination degree of the channel structure CH toward the channel structure CH of which a width difference according to a height thereof is decreased, so that the upper and lower conductive patterns CP_T and CP_B may be formed with uniform widths.

Figure 11:
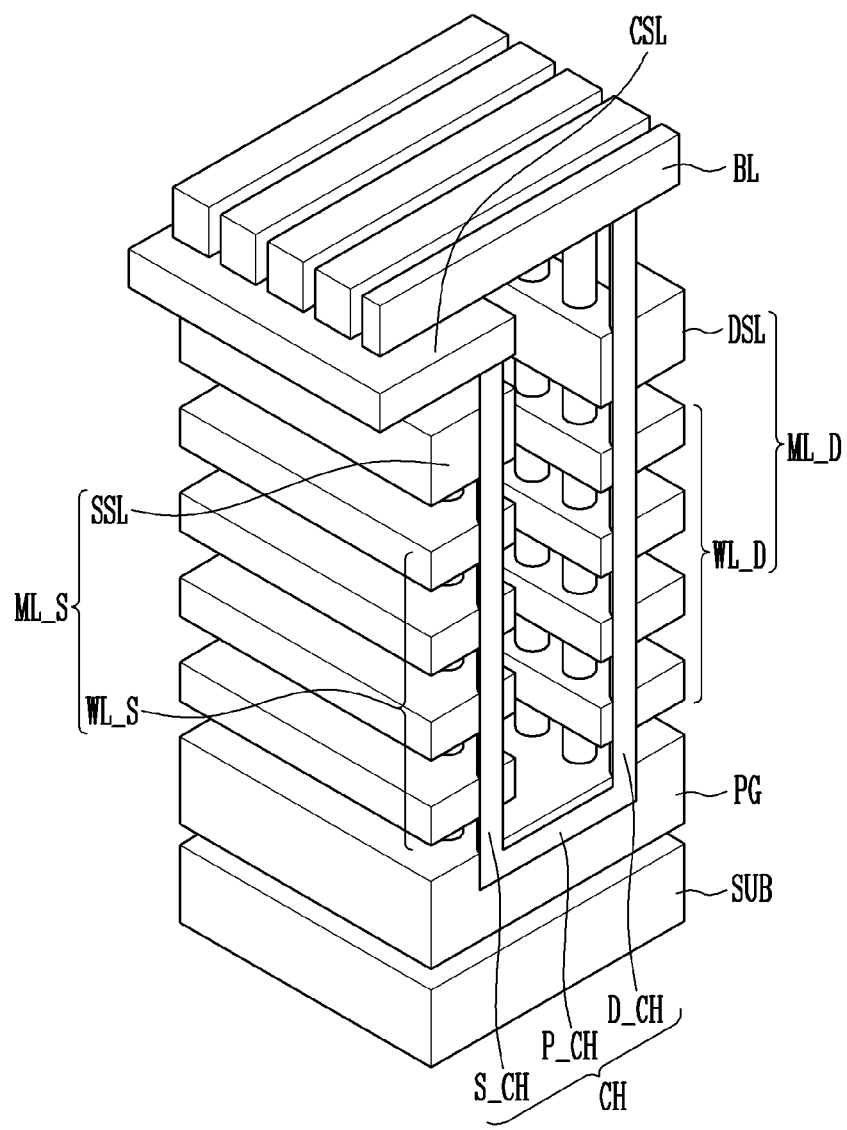
FIG. 11 is a perspective view for describing a U-shaped memory string according to an embodiment of the invention.

Referring to FIG. 11, a perspective view for describing a U-shaped memory string according to an embodiment of the invention is described. In FIG. 11, insulating layers are not illustrated.

In FIG. 11, a memory string may be arranged along a channel structure connected between a bit line BL and a common source line CSL. In FIG. 11, a case where the channel structure CH is formed in a U-shape is illustrated, but the channel structure CH may be formed in various shapes, such as a W-shape. The bit line BL and the common source line CSL are spaced apart from each other on different layers. For example, the common source line CSL may be disposed under the bit line BL. The bit line BL and the common source line CSL are formed of a conductive material.

A pipe gate PG may be disposed under the bit line BL and the common source line CSL. The pipe gate PG is formed of a conductive material.

A drain-side stack structure ML_D and a source-side stack structure ML_S may be disposed on the pipe gate PG. The drain-side stack structure ML_D and the source-side stack structure ML_S are disposed under the bit line BL and the common source line CSL. The drain-side stack structure ML_D and the source-side stack structure ML_S may be electrically separated by a slit.

The drain-side stack structure ML_D includes drain-side conductive patterns WL_D and DSL stacked while being spaced apart from each other. The source-side stack structure ML_S includes source-side conductive patterns WL_S and SSL stacked while being spaced apart from each other. The drain-side conductive patterns WL_D and DSL include one or more drain select lines DSL and drain-side word lines WL_D between the drain select line DSL and the pipe gate PG. The source-side conductive patterns WL_S and SSL include one or more source select lines SSL and source-side word lines WL_S between the source select line SSL and the pipe gate PG.

The channel structure CH may include a first part D_CH passing through the drain-side stack structure ML_D, a second part S_CH passing through the source-side stack structure ML_S, and a third part P_CH passing through the pipe gate PG to electrically couple the first part D_CH and the second part S_CH.

The first part D_CH of the channel structure CH may be electrically coupled to the bit line BL. The second S_CH of the channel structure CH may be electrically coupled to the common source line CSL.

An external wall of the channel structure CH may be surrounded by a memory layer, and the memory layer may be formed in the structure illustrated in FIG. 1 or 3.

According to the aforementioned structure, at least one drain select transistor, drain-side memory cells, a pipe transistor, source-side memory cells, and at least one source select transistor, which are serially connected, form one memory string. Further, the memory string is arranged in a U-shape.

The memory string may be formed by forming a pipe gate PG including a pipe hole embedded with a sacrificial layer and then performing the processes aforementioned in the embodiments above.

Figure 12B:
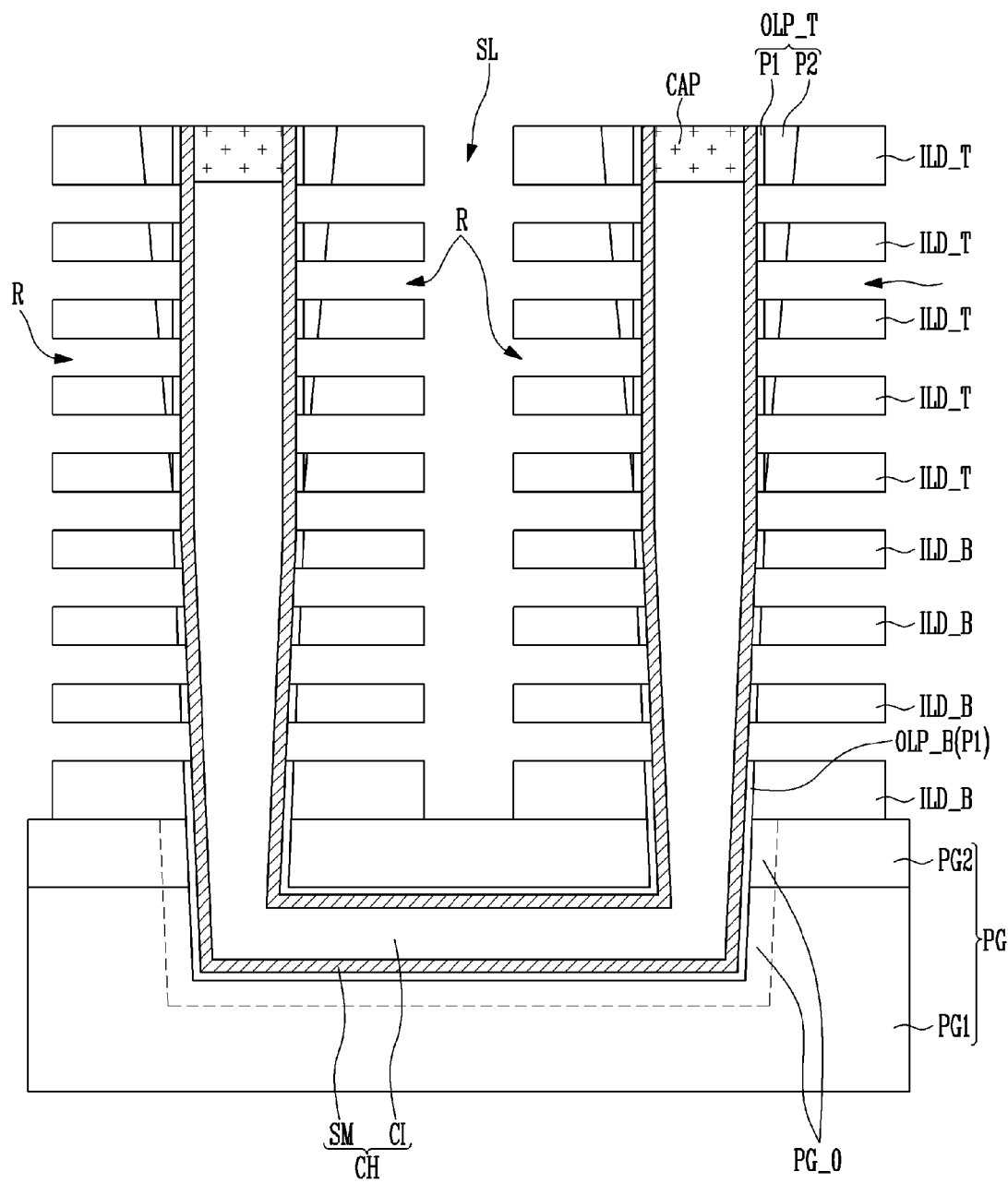
Figure 12C:
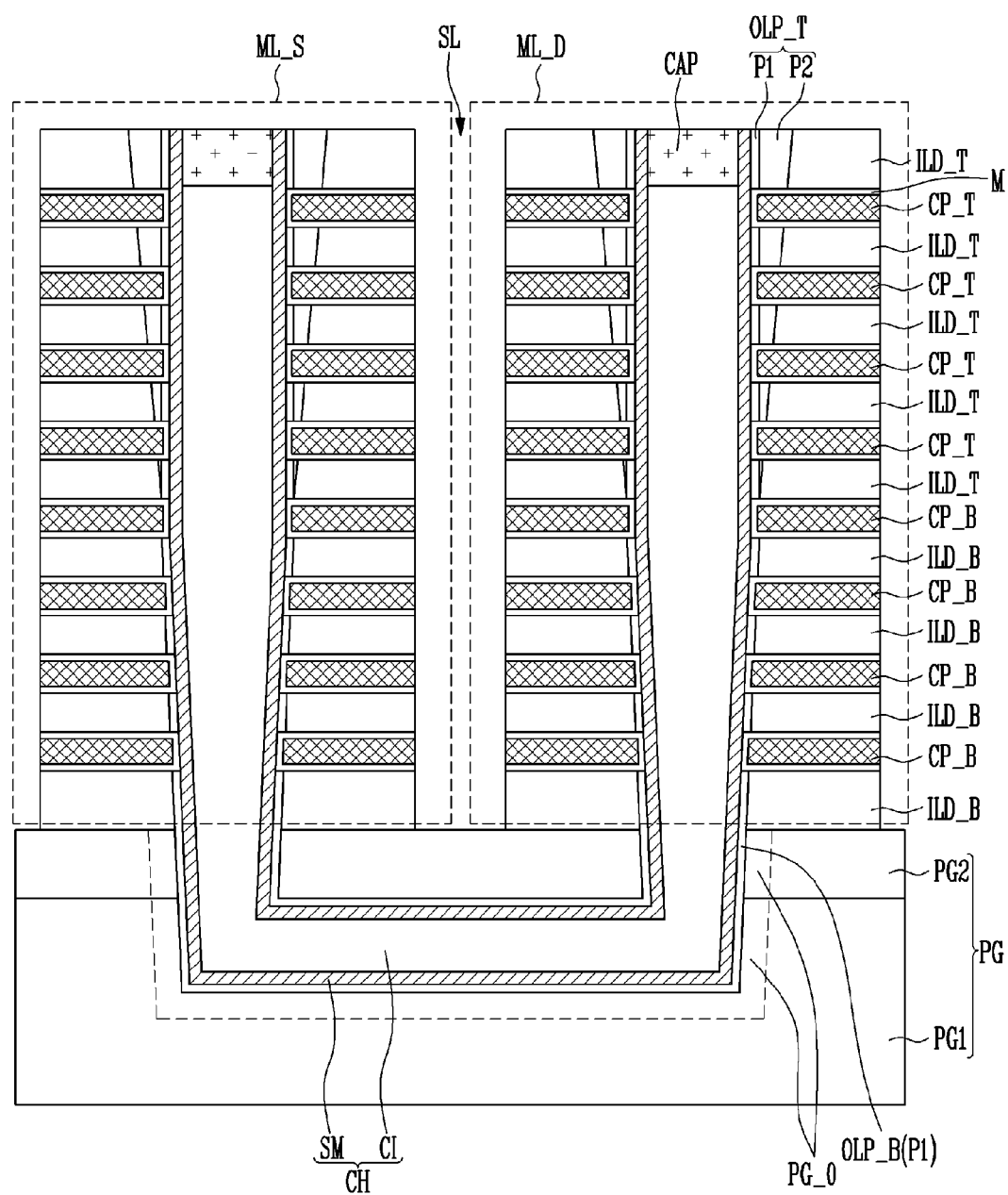

Referring to FIGS. 12A to 12C, cross-sectional views for describing a method of forming a U-shaped memory string by applying the method of manufacturing the semiconductor device according to an embodiment of the invention is described.

In FIG. 12A, a first pipe gate layer PG1 is formed on a substrate. The first pipe gate PG1 may be formed of a conductive layer. After the first pipe gate layer PG1 is formed, a pipe hole H_P is formed by etching the first pipe gate layer PG1. Next, an internal side of the pipe hole H_P is filled with a pipe sacrificial layer 701. The pipe sacrificial layer 701 may include TiN.

Then, a second pipe gate layer PG2 is formed on the first pipe gate layer PG1 filled with the pipe sacrificial layer 701. The second pipe gate PG2 may be formed of a conductive layer. Next, interlayer insulating layers 711 and sacrificial layers 713 are alternately stacked each layer to form a stack structure ML. Material properties of the interlayer insulating layers 711 and the sacrificial layers 713 are the same as those described with reference to FIG. 2A.

Next, holes H_S and H_D passing through the stack structure ML and the second pipe gate layer PG2 are formed. At least a pair of source side hole H_S and drain side hole H_D may be electrically coupled to the pipe hole H_P.

In FIG. 12B, the pipe hole H_P is opened by removing the pipe sacrificial layer 701. Then, inclination degrees of lateral sidewalls of the source and drain side holes H_S and H_D are controlled by using any one method among the methods described in the embodiments above, and then a channel structure CH and a capping layer CAP are formed. Then, recess regions R defined as transistor regions are formed between interlayer insulating patterns ILD by using any one method among the methods described in the embodiments above.

More particularly, according to the case where the third embodiment described above is applied, a tapered layer similar to that described with reference to FIG. 6A is formed along inclined lateral walls of the source and drain side holes H_S and H_D. Further, an annealing process for improving density of the tapered layer is performed.

Next, as illustrated in FIG. 6B, an oxide layer including first and second regions P1 and P2 is formed by performing a radical oxidation process. In this case, partial regions of the sacrificial layers may be oxidized with various widths identically to the description described with reference to FIG. 6B, and the oxide layer has a tapered shape. Widths of the oxide regions of the sacrificial layers are the same as those described with reference to FIG. 6B. Surfaces of the pipe gate layers PG1 and PG2 opened by the pipe hole H_P are oxidized during the radical oxidization process, so that a radical oxide region PG_O may be formed. Non-oxide regions of the first and second pipe gate layers PG1 and PG2 may be used as the pipe gate PG.

Then, the channel structure CH is formed inside the source and drain side holes H_S and H_D and the pipe hole H_P. The channel structure CH is formed inside the source and drain side holes H_S and H_D and the pipe hole H_P opened by the oxide layer OL. The channel structure CH may include a semiconductor layer SM formed along a surface of the oxide layer and a core insulating layer CI surrounded by the semiconductor layer SM. The core insulating layer CI may be formed to be lower than the source and drain side holes H_S and H_D. Each of the center regions of the source and drain side holes H_S and H_D opened on the core insulating layer CI may be filled with the capping layer CAP.

By contrast to the above description, the channel structure CH may be formed by completing embedding the inner sides of the source and drain side holes H_S and H_D and the pipe hole H_P opened by the oxide layer OL with the semiconductor layer SM.

The channel structure CH is formed in a state where a difference in a width between an upper region and a lower region of the hole is decreased by the oxide layer having the tapered shape, so that it is possible to improve uniformity of the width of the channel structure CH. Further, partial regions of the channel structure CH disposed at an inner side of each of the source and drain side holes H_S and H_D may be divided into an upper region and a lower region according to an inclination degree as described with reference to FIG. 5B.

Next, the non-oxide regions of the sacrificial layers 713 (see FIG. 12A) are exposed by forming a slit SL passing through the stack structure. Accordingly, the interlayer insulating layers may be divided into upper interlayer insulating patterns ILD_T and lower interlayer insulating patterns ILD_B by the slit SL. The upper interlayer insulating patterns ILD_T may have lateral walls having an angle close to 90° with respect to a surface of the substrate compared to the lower interlayer insulating patterns ILD_B.

Then, the non-oxide regions of the sacrificial layers 713, the oxide regions of the sacrificial layers 713, and the partial regions of the oxide layer are removed by the same processes as those described with reference to FIGS. 6D and 6E. Accordingly, recess regions R exposing the channel structure CH are formed. Further, the oxide layer is divided into the upper and lower oxide layer patterns OLP_T and OLP_B by the recess regions R. The upper oxide layer patterns OLP_T are in contact with the upper interlayer insulating patterns ILD_T, and the lower oxide layer patterns OLP_B are in contact with the lower interlayer insulating patterns ILD_B.

In FIG. 12C, a memory layer M is formed along a surface of each of the recess regions R by the same process as that described with reference to FIG. 6F. Further, upper and lower conductive patterns CP_T and CP_B filled in the recess regions R are formed on the memory layer M. The upper and lower conductive patterns CP_T and CP_B and the upper and lower interlayer insulating patterns ILD_T and ILD_B may be divided into a source side stack structure ML_S and a drain side stack structure ML_D separated by the slit SL. The upper and lower conductive patterns CP_T and CP_B of the source side stack structure ML_S may be divided into one or more source select lines and source side word lines disposed between the source select line and the pipe gate PG. The upper and lower conductive patterns CP_T and CP_B of the drain side stack structure ML_D may be divided into one or more drain select lines and drain side word lines disposed between the drain select line and the pipe gate PG.

FIGS. 12A to 12C illustrate the method of forming the U-shaped memory string by applying the method of manufacturing the semiconductor device according to an embodiment of the invention, but the invention is not limited thereto. Although not particularly illustrated, the U-shaped memory string illustrated in FIG. 11 may be formed by using the manufacturing methods according to the various embodiments of the invention described above.

Figure 13:
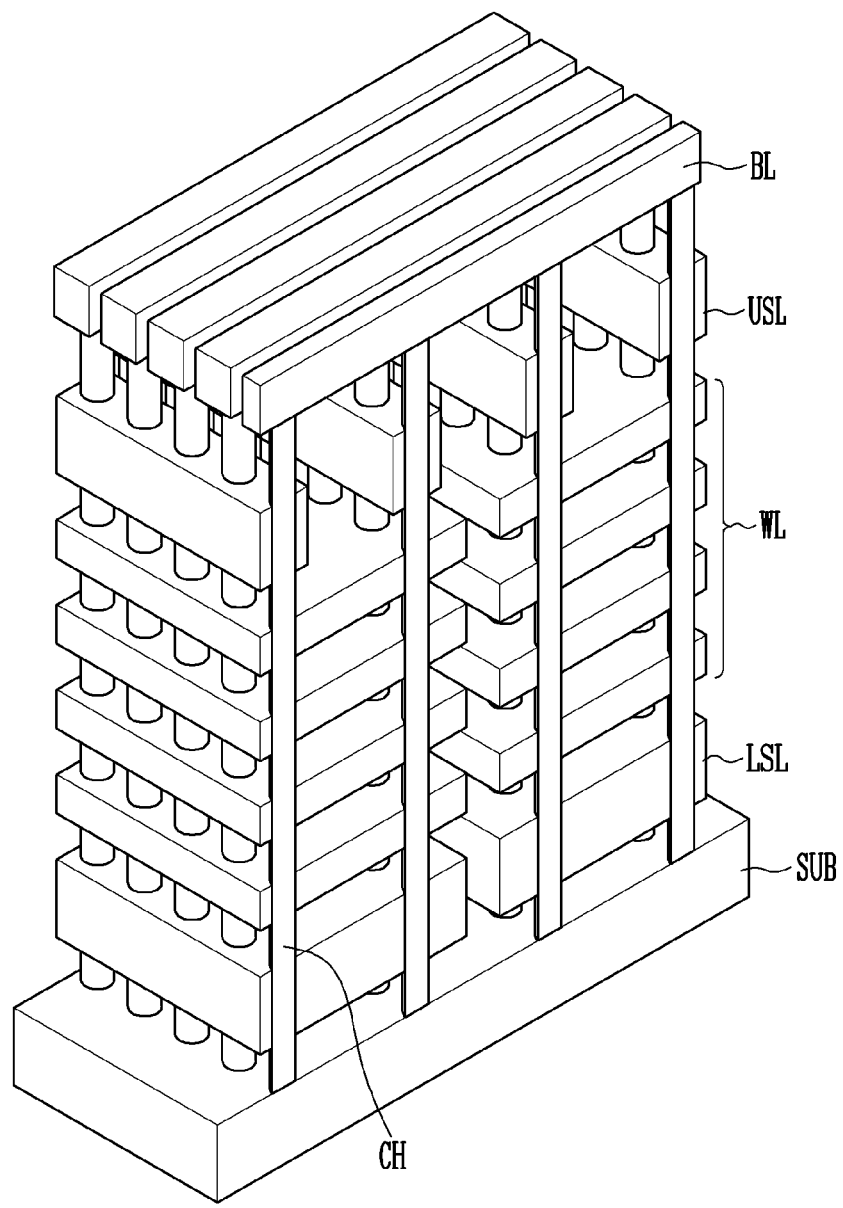
FIG. 13 is a perspective view for describing a straight-type memory string according to an embodiment of the invention.

Referring to FIG. 13, a perspective view for describing a straight-type memory string according to an embodiment of the invention is described.

In FIG. 13, the memory string may be formed along a straight-type channel structure CH. The straight-type memory string may be electrically coupled between a semiconductor substrate SUB including a source region and a bit line BL. Conductive patterns LSL, WL, and USL are stacked between the semiconductor substrate SUB and the bit line BL while being spaced apart from each other. The conductive patterns LSL, WL, and USL may be divided by a slit.

The semiconductor substrate SUB including the source region may be directly electrically coupled to a lower side of the channel structure CH. The source region may be formed by injecting an impurity into the semiconductor substrate SUB, or depositing a doped silicon layer on the semiconductor substrate SUB.

The conductive patterns LSL, WL, and USL may include one or more lower select lines LSL, word lines WL disposed on the lower select line LSL, and one or more upper select lines USLs disposed on the word lines WL. Here, the word lines WL may be formed in a plate shape, and any one of the lower and upper select lines LSL and USL may be formed in a line shape. Otherwise, the word lines WL and the lower and upper select lines LSL and USL may be formed in a line shape.

The channel structure CH passes through the conductive patterns LSL, WL, and USL. A memory layer may be formed between the channel structure CH and the conductive patterns LSL, WL, and USL. The memory layer may be formed in the configurations and the structures illustrated in FIGS. 1 and 3. The channel structure CH is electrically coupled to the bit line BL.

According to the aforementioned structure, at least one lower selection transistor, memory cells, and at least one upper selection transistor, which are serially connected, form one memory string, and the memory string is arranged in a row.

The memory string may be formed on the semiconductor substrate SUB including the source region by using the processes described in the various embodiments of the invention.

In various embodiments of the invention, it is possible to decrease or remove a width difference of a channel structure according to a height by using a layer having a tapered shape, of which a width is decreased toward a lower side, and having high density, and it is possible to decrease or remove a difference in a width between conductive patterns disposed at different heights. As a result, in various embodiments of the invention, it is possible to improve reliability of an operation of the semiconductor device.

Figure 14:
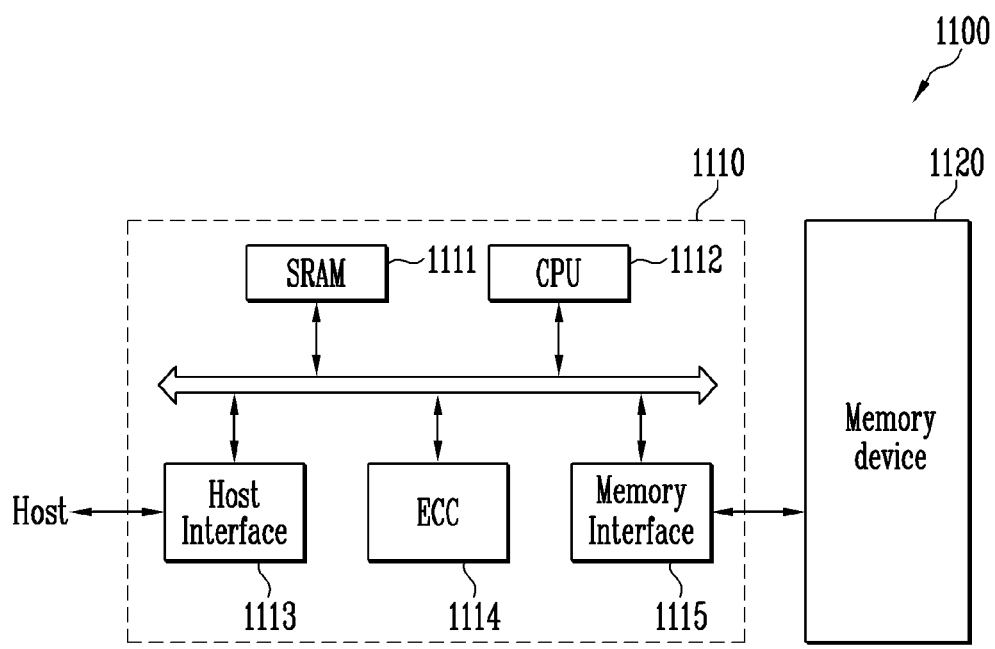
FIG. 14 is a configuration diagram illustrating a memory system according to an embodiment of the invention.

Referring to FIG. 14, a configuration diagram illustrating a memory system according to an embodiment of the invention is shown.

In FIG. 14, a memory system 1100 according to an embodiment of the invention includes a memory device 1120 and a memory controller 1110.

The memory device 1120 has the structures described with reference to FIGS. 1, 3, 5, 7, 8, 10, 11, and 13. Further, the memory device 1120 may be a multi-chip package formed of a plurality of flash memory chips.

The memory controller 1110 may be configured to control the memory device 1120, and may include an SRAM 1111, a CPU 1112, a host interface 1113, an ECC 1114, and a memory interface 1115. The SRAM 1111 is used as a working memory of the CPU 1112, the CPU 1112 performs a general control operation for data exchange of the memory controller 1110. Further, the host interface 1113 includes a data exchange protocol of the host electrically coupled to the memory system 1100. Further, the ECC 1114 detects and corrects an error included in data read from the memory device 1120. In addition, the memory interface 1115 performs interfacing with the memory device 1120. Moreover, the memory controller 1110 may further include an ROM for storing code data for the interfacing with the host.

As described above, the memory system 1100 including the aforementioned structure may be a memory card or a Solid State Disk (SSD) in which the memory device 1120 is combined with the memory controller 1110. For example, when the memory system 1100 is the SSD, the memory controller 1110 may communicate with an external device (for example, a host) through one of various interface protocols, such as USB, MMC, PCI-E, SATA, PATA, SCSI, ESDI, and IDE.

Figure 15:
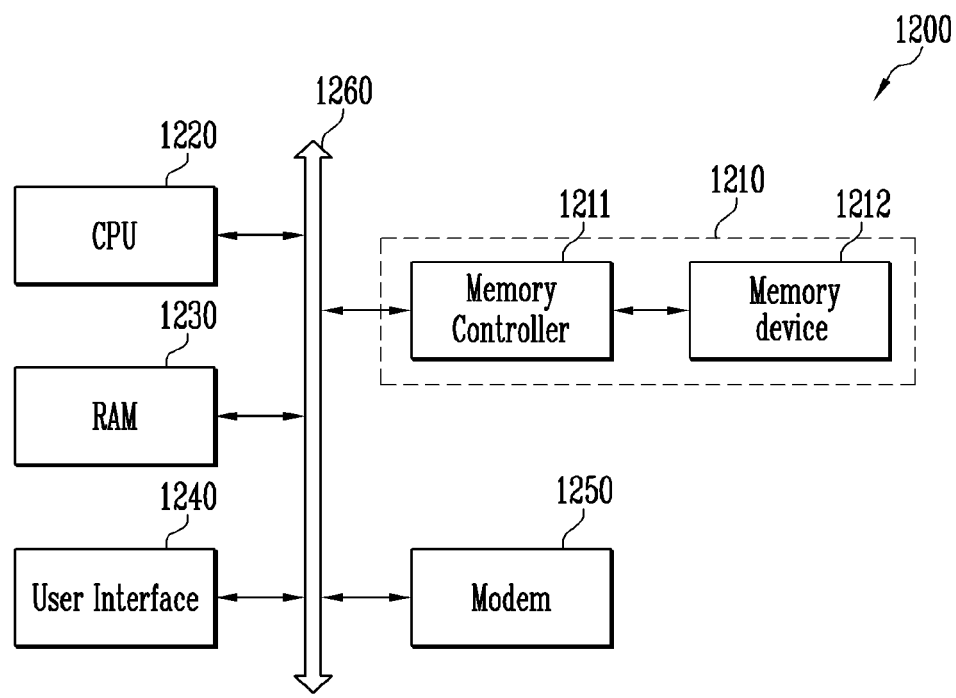
FIG. 15 is a configuration diagram illustrating a computing system according to an embodiment of the invention.

Referring to FIG. 15, a diagram illustrating a computing system according to an embodiment of the invention is described.

In FIG. 15, a computing system 1200 according to an embodiment of the invention may include a CPU 1220, a RAM 1230, a user interface 1240, a modem 1250, and a memory system 1210, which are electrically coupled to a system bus 1260. Further, where the computing system 1200 is a mobile device, the computing system 1200 may further include a battery for supplying an operational voltage to the computing system 1200 and may further include an application chip-set, a camera image sensor CIS, a mobile DRAM, and the like.

The memory system 1210 may be formed of a memory device 1212 and a memory controller 1211 as previously described with reference to FIG. 14.

As described above, the embodiment has been disclosed in the drawings and the specification. The specific terms used herein are for purposes of illustration, and do not limit the scope of the invention defined in the claims. Accordingly, those skilled in the art will appreciate that various modifications and another equivalent example may be made without departing from the scope and spirit of the invention. Therefore, the sole technical protection scope of the invention will be defined by the technical spirit of the accompanying claims.

What is claimed is:

1. A semiconductor device, comprising:
    interlayer insulating patterns and conductive patterns alternately stacked on a substrate;
    a channel structure passing through the interlayer insulating patterns and the conductive patterns; and
    tapered patterns interposed between the channel structure and the interlayer insulating patterns, spaced apart with any one of the conductive patterns interposed therebetween, and having widths decreased toward the substrate,
    wherein the interlayer insulating patterns are formed of a material having higher density than the tapered patterns.

2. The semiconductor device of claim 1, wherein a width of an upper pattern among the tapered patterns is larger than a width of a lower pattern disposed to be closer to the substrate than the upper pattern.

3. The semiconductor device of claim 1, wherein the conductive patterns further protrude toward the channel structure than the interlayer insulating patterns.

4. The semiconductor device of claim 1, wherein a width of each of the interlayer insulating patterns is increased toward the substrate.

5. The semiconductor device of claim 1, wherein the tapered patterns include an oxide layer.

6. A semiconductor device, comprising:
    lower interlayer insulating patterns and lower conductive patterns alternately stacked on a substrate;
    upper interlayer insulating patterns and upper conductive patterns alternately stacked on the lower interlayer insulating patterns and the lower conductive patterns;
    a channel structure including an upper region passing through the upper interlayer insulating patterns and the upper conductive patterns and a lower region passing through the lower interlayer insulating patterns and the lower conductive patterns;
    upper oxide layer patterns interposed between the upper region of the channel structure and the upper interlayer insulating patterns, spaced apart with any one of the upper conductive patterns interposed therebetween, and each having a total width decreased toward the substrate; and
    lower oxide layer patterns interposed between the lower region of the channel structure and the lower interlayer insulating patterns, and spaced apart with any one of the lower conductive patterns interposed therebetween,
    wherein the lower oxide layer patterns have the same total width as each other.

7. The semiconductor device of claim 6, wherein a width of an upper pattern among the upper oxide layer patterns is larger than a width of a lower pattern among the upper oxide layer patterns disposed to be closer to the substrate than the upper pattern.

8. The semiconductor device of claim 6, wherein the upper conductive patterns and the lower conductive patterns further protrude toward the channel structure than the upper interlayer insulating patterns and the lower interlayer insulating patterns.

9. The semiconductor device of claim 6, wherein each of the upper oxide layer patterns includes a first region surrounding the upper region of the channel structure, and a second region surrounding the upper region of the channel structure with the first region interposed therebetween,
    wherein a width of the second region is decreased toward the substrate.

10. The semiconductor device of claim 6, wherein a width of each of the lower interlayer insulating patterns is increased toward the substrate.

11. The semiconductor device of claim 6, wherein a width of a lower pattern among the upper interlayer insulating patterns is larger than a width of an upper pattern among the upper layer insulation patterns disposed to be further from the substrate than the lower pattern.

12. The semiconductor device of claim 6, further comprising:
a memory layer formed to be in contact with an external wall of the channel structure to surround the channel structure.

13. A semiconductor device, comprising:
lower interlayer insulating patterns and lower conductive patterns alternately stacked on a substrate;
upper interlayer insulating patterns and upper conductive patterns alternately stacked on the lower interlayer insulating patterns and the lower conductive patterns; and
a channel structure including an upper region, which passes through the upper interlayer insulating patterns and the upper conductive patterns and has a lateral wall inclined at a first angle with respect to a surface of the substrate, and a lower region, which passes through the lower interlayer insulating patterns and the lower conductive patterns and has a lateral wall inclined at a second angle with respect to the surface of the substrate, in which the first angle is closer to 90° than the second angle,
wherein a width of the lower region of the channel structure gradually increases toward the upper region of the channel structure.

14. The semiconductor device of claim 13, further comprising:
upper oxide layer patterns interposed between the upper region and the upper interlayer insulating patterns, spaced apart with any one of the upper conductive patterns interposed therebetween, and having widths decreased toward the substrate; and
lower oxide layer patterns interposed between the lower region and the lower interlayer insulating patterns, and spaced apart with any one of the lower conductive patterns interposed therebetween.

15. The semiconductor device of claim 14, wherein each of the upper oxide layer patterns includes a first region surrounding the upper region, and a second region surrounding the upper region with the first region interposed therebetween and having one of the widths decreased toward the substrate.

16. The semiconductor device of claim 15, wherein the upper and lower interlayer insulating patterns are formed of a denser film quality than the second region of each of the upper oxide layer patterns.

17. The semiconductor device of claim 13, wherein the upper interlayer insulating patterns are formed with a same width.

18. The semiconductor device of claim 13, further comprising:
a semiconductor layer within the channel structure wherein a thickness of the semiconductor layer is configured to be uniform.

19. The semiconductor device of claim 13, wherein the upper region of the channel structure is configured to have the lateral wall be closer to the surface of the substrate as compared to the lower region of the channel structure.

20. The semiconductor device of claim 13, wherein widths between the upper conductive patterns and the lower conductive patterns are configured to be uniform.

* * * * *